(12) United States Patent
Wada et al.

(10) Patent No.: US 6,924,544 B2
(45) Date of Patent: Aug. 2, 2005

(54) SEMICONDUCTOR DEVICE AND MANUFACTURING METHOD OF THE SAME

(75) Inventors: Shinichiro Wada, Fuchu (JP); Hiromi Shimamoto, Iruma (JP)

(73) Assignees: Hitachi, Ltd., Tokyo (JP); Hitachi Display Devices, Ltd., Chiba (JP)

( * ) Notice: Subject to any disclaimer, the term of this patent is extended or adjusted under 35 U.S.C. 154(b) by 0 days.

(21) Appl. No.: 10/766,182

(22) Filed: Jan. 29, 2004

(65) Prior Publication Data

US 2004/0183157 A1 Sep. 23, 2004

(30) Foreign Application Priority Data

Jan. 29, 2003 (JP) .................................... P2003-019790

(51) Int. Cl.[7] .............................................. H01L 29/00
(52) U.S. Cl. ....................... 257/536; 257/754; 257/755; 438/382; 438/655; 438/682
(58) Field of Search ................................ 257/536, 754, 257/755; 438/382, 655, 682

(56) References Cited

U.S. PATENT DOCUMENTS 5,172,211 A * 12/1992 Godinho et al. ............ 257/536

FOREIGN PATENT DOCUMENTS

| JP | 2000-31295 | 7/1998 |
|---|---|---|
| JP | 2000-307060 | 4/1999 |

* cited by examiner

Primary Examiner—Edward Wojciechowicz
(74) Attorney, Agent, or Firm—Reed Smith LLP; Stanley P. Fisher, Esq.; Juan Carlos A. Marquez, Esq.

(57) ABSTRACT

A semiconductor device with a resistor element whose the resistance value can be adjusted to a desired value without changing dimensions thereof is provided. The resistor element is formed of a poly-Si layer formed on an insulator over a semiconductor substrate. An impurity is introduced into the poly-Si layer by the use of ion implantation. In the vicinity of both ends of the poly-Si layer forming the resistor element, silicide layers each made of cobalt silicide or the like are formed over an upper surface of the poly-Si layer. The area of one silicide layer is larger than that of the other silicide layer. By adjusting the area of the one silicide layer, the length between the silicide layers is adjusted and the resistance value of the resistor element can be adjusted without changing the shape of the poly-Si layer.

20 Claims, 16 Drawing Sheets

SEMICONDUCTOR DEVICE AND MANUFACTURING METHOD OF THE SAME

BACKGROUND OF THE INVENTION

The present invention relates to a semiconductor device and a manufacturing method of the same and, more particularly, to a technique effectively applied to the semiconductor device with a resistor element made of silicon.

Japanese Patent Laid-Open No. 2000-307060 discloses the technique in which a refractory metal silicide layer is formed as a resistive electrode on an upper surface of a poly-Si layer and an aluminum wiring is connected to the refractory metal silicide layer through a contact and, in this manner, a resistor element using a poly-Si layer is formed (see Patent document 1).

Japanese Patent Laid-Open No. 2000-31295 discloses the semiconductor integrated circuit device provided with: a transistor having an operation region and an electrode formed by processing a salicide layer; and a resistor element having a salicide layer formed only at the connection part thereof, wherein both the salicide layers are formed in the same process (see Patent document 2).

[Patent Document 1]
Japanese Patent Laid-Open No. 2000-307060
[Patent Document 2]
Japanese Patent Laid-Open No. 2000-31295

SUMMARY OF THE INVENTION

According to the examinations by the inventors of the present invention, a resistance value of the resistor element greatly influences performance and characteristics of a circuit in the semiconductor device. In an ECL (Emitter Coupled Logic) circuit, for example, amplitude of the waveform is changed depending on the resistance value of the resistor element and, therefore, the resistance value influences the operation speed. Additionally, in an oscillator using a resistor element and a capacitor, the resistance value influences the oscillation frequency. Furthermore, in the case where it is used as a terminal resistor, variation of the resistance value from the design value causes the deterioration of the impedance matching characteristics. Due to this, after making a prototype of the circuit and evaluating the characteristics thereof, the resistance value of the resistor element is adjusted and, then, the semiconductor device is mass-produced. In this manner, it becomes possible to manufacture the semiconductor device with desired characteristics and performance. There are two methods available for the adjustment of the resistance value, a first method that changes impurity concentration in a silicon layer constituting the resistor element so as to adjust the sheet resistance of the resistor element and a second method that changes the layout of the resistor element.

In the first method, since the resistance values of all of the resistor elements in the same semiconductor chip are varied, it is difficult to change and adjust only the resistance values of the particular resistor elements in a circuit.

In the second method, it is necessary to adjust dimensions of the resistive element of the resistor element. Since the resistor element is formed in the same process as the transistor, there are many processing steps performed after forming the resistor element and it takes much time to complete the manufacture of the circuit in which the resistance value of the resistance is adjusted. Also in the second method, it is difficult to adopt a gate array system in which a desired circuit is constituted by forming the transistors and the passive elements in advance and by adjusting the layout of the wiring layers to provide connections between the devices. Further, in the second method, the change in the layout of the resistive element (silicon layer) constituting the resistor element, that in the layout of the contacts connected to the resistor elements, and that in the layout of the wiring layers connected to the contacts, etc. are required in order to change the resistance value of the resistor element, and the number of changed ones of masks (exposure masks) used in the exposure process is many, which leads to the increase of the manufacturing cost.

An object of the present invention is to provide a semiconductor device with a resistor element whose the resistance value can be adjusted without changing the dimensions thereof, and provide a manufacturing method of the same.

Another object of the present invention is to provide a semiconductor device capable of reducing the manufacturing cost and a manufacturing method of the same.

The above and other objects and novel characteristics of the present invention will be apparent from the description of the specification and the accompanying drawings.

The typical ones of the inventions disclosed in this application will be briefly described as follows.

The semiconductor device according to the present invention is a device in which: a first silicide region and a second silicide region are formed on a resistor element made of silicon; and the length between one end of the resistor element and an end of the first silicide region located on a side facing the second silicide region is longer than the length between the other end of the resistor element and an end of the second silicide region located on a side facing the first silicide region.

DESCRIPTION OF THE PREFERRED EMBODIMENTS

Figure 1:
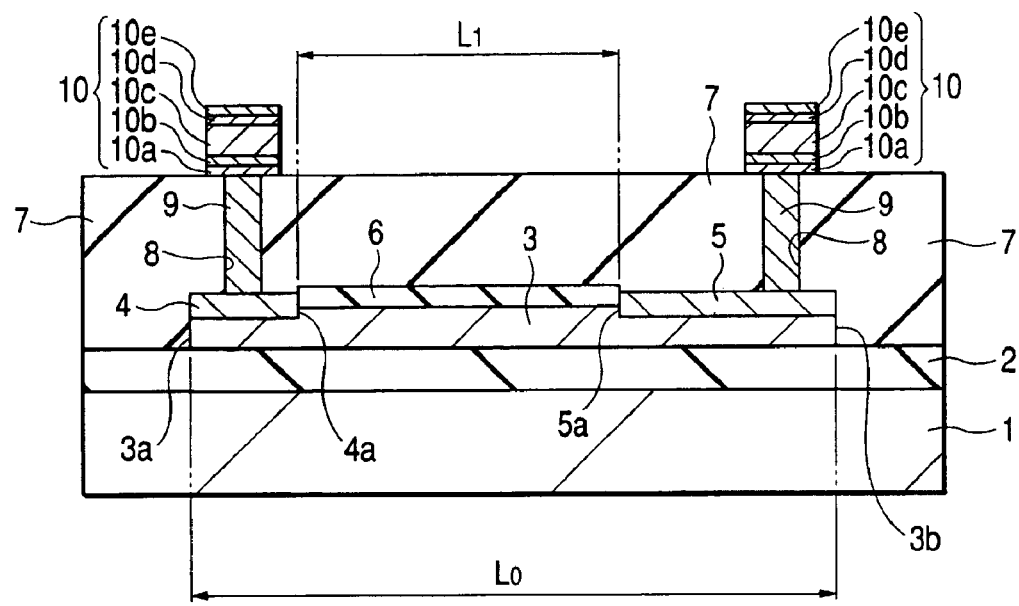
FIG. 1 is a sectional view showing the principal part of a structure of a resistor element in a semiconductor device according to an embodiment of the present invention.

In embodiments described below, the invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof.

Also, in the embodiments described below, when referring to the number of an element (including number of pieces, values, amount, range, and the like), the number of the element is not limited to a specific number unless otherwise stated or except the case where the number is apparently limited to a specific number in principle. The number larger or smaller than the specified number is also applicable.

Further, in the embodiments described below, it goes without saying that components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. This condition is also applicable to the numerical value and the range described above.

Also, components having the same function are denoted by the same reference symbols throughout the drawings for describing the embodiments, and the repetitive description thereof will be omitted. Additionally, the description of the same or similar portions is not repeated in principle unless particularly required in the following embodiments.

Also, in the drawings used in the embodiments, hatching is used in some cases even in a plan view so as to make the drawings easy to see.

Hereinafter, the embodiments of the present invention will be described in detail with reference to the accompanying drawings.

First Embodiment

Figure 2:
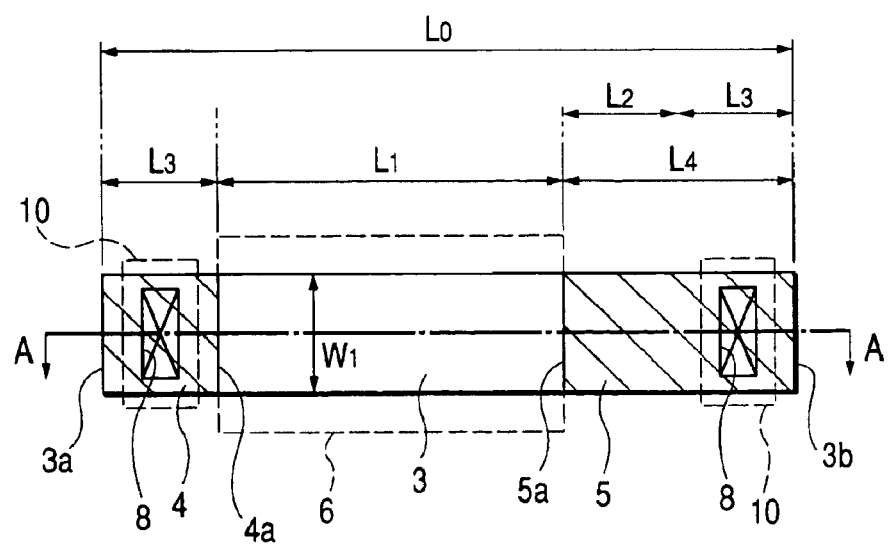
FIG. 2 is a plan view of the resistor element in FIG. 1.

The resistor element in the semiconductor device according to the first embodiment will be described with reference to the drawings. FIG. 1 is a sectional view showing the principal part of a structure of a resistor element in the semiconductor device (semiconductor integrated circuit device) according to an embodiment of the present invention, and FIG. 2 is a plan view (plan layout diagram) thereof. The sectional view taken along line A—A in FIG. 2 corresponds to FIG. 1.

As shown in FIGS. 1 and 2, the resistor element is formed of a poly-Si (polysilicon) layer 3 formed on an insulator 2 made of, for example, silicon oxide formed on a semiconductor substrate (semiconductor wafer, silicon substrate) 1 made of, for example, p type single crystal silicon. The amount of introduction of the impurity (impurity density) into the poly-Si layer 3 by the ion implantation is controlled so that the sheet resistance of the poly-Si layer 3 constituting the resistor element can have a desired value (resistance value) in a range of, for example, several tens $\Omega/\square$ to several thousands $\Omega/\square$.

On the surface (upper surface) of the poly-Si layer 3, a silicide layer (silicide region, salicide layer) 4 and a silicide layer (silicide region, salicide layer) 5 are respectively formed in the vicinity of both ends of the poly-Si silicon 3 constituting the resistor element. The silicide layers 4 and 5 are made of, for example, cobalt silicide ($CoSi_2$) that is a compound of cobalt (Co) belonging to a refractory metal and silicon (Si). The compound of another refractory metal and silicon (Si), for example, titanium silicide ($TiSi_2$), tungsten silicide ($WSi_2$), molybdenum silicide ($MoSi_2$), tantalum silicide ($TaSi_2$) and the like can be used as the material of the silicide layers 4 and 5. Each sheet resistance of the silicide layers 4 and 5 is a range of, for example, approximately several $\Omega/\square$ to several tens $\Omega/\square$, which is smaller than that of the poly-Si layer 3.

Regions on the surface (upper surface) of the poly-Si layer 3 and not forming the silicide layers 4 and 5 are covered with a relatively thin insulator 6. Additionally, a relatively thick insulator (interlayer insulator) 7 made of, for example, silicon oxide is formed over the semiconductor substrate 1 so as to cover the poly-Si layer 3, the silicide layers 4 and 5, and the insulator 6. The silicide layers 4 and 5 are electrically connected to electrodes (wirings) 10 formed on the insulator 7, through plug contacts (contact parts) 9 buried in contacts 8 formed in the insulator 7. The electrode 10 is formed of a laminated layer, which is composed of: a refractory metal layer such as a titanium layer 10a; a refractory metal nitride layer such as a titanium nitride layer 10b; an elemental substance of aluminum (Al), or a conductor layer containing aluminum as a main component such as an aluminum alloy, that is, an aluminum layer 10c; a refractory metal layer such as a titanium layer 10d; and a refractory metal nitride layer such as a titanium nitride layer 10e.

In this embodiment, the shape of the silicide layer 4 is different from that of the silicide layer 5, and an area of the silicide layer 5 is larger than that of the silicide layer 4. By adjusting the area of the silicide layer 5, the length $L_1$ between the silicide layers 4 and 5 (length between an end 4a of the silicide layer 4 located on a side facing to the silicide layer 5 and an end 5a of the silicide layer 5 located on a side facing to the silicide layer 4) can be adjusted without changing the shape of the poly-Si layer 3 (pattern shape, for example, the length $L_0$ of the poly-Si layer 3 in an extending direction (length in a longitudinal direction)).

The (total) resistance value $R_0$ of the resistor element shown in FIGS. 1 and 2 includes the resistance value of the poly-Si silicon layer 3, those of the silicide layers 4 and 5, and the contact resistance value between the poly-Si layer 3 and each of the silicide layers 4 and 5, and it is given by the following formula:

$$R_0 = R_{S1} \times L_1/W_1 + R_{S2} \times L_2/W_1 + R_{C0} \times 2/W_1.$$

In this case, the $R_{S1}$ corresponds to the sheet resistance ($\Omega/\square$) of the poly-Si layer 3. The $R_{S2}$ corresponds to each of the sheet resistance ($\Omega/\square$) of the silicide layers 4 and 5. The $L_1$ corresponds to the length (closest length) between the silicide layers 4 and 5. The $L_2$ corresponds to the increased amount of the length $L_4$ of the silicide layer 5 in the extending direction (longitudinal direction) of the poly-Si layer 3 relative to (on the basis of) the length $L_3$ of the silicide layer 4 in the extending direction (longitudinal direction) of the poly-Si layer 3. More specifically, the $L_2$ corresponds to (the absolute value of) the difference between the length $L_4$ of the silicide layer 5 in the extending direction of the poly-Si layer 3 and the length $L_3$ of the silicide layer 4 in the extending direction of the poly-Si layer 3 ($L_2 = L_4 - L_3$ or $L_2 = |L_4 - L_3|$). The $W_1$ corresponds to the width (the width in the direction vertical to the extending direction of the poly-Si layer 3) of the resistor element (poly-Si layer 3). The $R_{C0}$ corresponds to the connection resistance between the resistor element (poly-Si layer 3) and the electrode (wiring) 10. The $R_{C0}$ is a value proportional to the width $W_1$ of the resistor element, and the contact resistance between the silicide layers 4 and 5 and the poly-Si layer 3 is a main component thereof.

The value of the sheet resistance $R_{S1}$ of the poly-Si layer 3 is relatively large (for example, several tens of times to several hundreds of times) in comparison to that of the sheet resistance $R_{S2}$ of the silicide layers 4 and 5. Therefore, the resistance value $R_0$ of the resistor element can be adjusted to a desired value by keeping the sum ($L_1 + L_2$) of the length $L_1$ and the length $L_2$ at a constant value and changing a ratio ($L_2/(L_1 + L_2)$) thereof. For example, by keeping the sum ($L_1 + L_2$) of the length $L_1$ and the length $L_2$ at a constant value and increasing the length $L_2$ (that is, by increasing the area of the silicide layer 5 to bring a position of the end 5a of the silicide layer 5 close to the end 4a of the silicide layer 4), the resistance value $R_0$ of the resistor element is reduced. Also, by keeping the sum ($L_1 + L_2$) of the length $L_1$ and the length $L_2$ at a constant value and reducing the length $L_2$ (that is, by reducing the area of the silicide layer 5 to bring a position of the end 5a of the silicide layer 5 away from the end 4a of the silicide layer 4), the resistance value $R_0$ of the resistor element is increased.

Since there can be adjusted the resistance value $R_0$ of the resistor element by keeping the sum ($L_1 + L_2$) of the length $L_1$ and the length $L_2$ at a constant value and changing the length $L_2$, it becomes unnecessary to change the shape (pattern shape) of the poly-Si layer 3 in adjusting (changing) the resistance value $R_0$ of the resistor element. For example, it is unnecessary to change the length $L_0$ of the poly-Si layer 3 in the extending direction (longitudinal direction). Also, it is unnecessary to change the positions of contacts 8 and plugs 9 (contact part) which are connected to the electrodes (wirings) 10. Additionally, it is unnecessary to change the shape (pattern shape) of the electrode (wiring) 10. Since the resistance value $R_0$ of the resistor element can be adjusted by changing the shape (pattern shape) of the silicide layer 5, the masks (exposure mask) necessary for the adjustment of the resistance value $R_0$ of the resistor element are only masks (exposure mask) used to form the silicide layers 4 and 5, for example, masks (exposure masks) for the patterning of the insulator 6. In the case of adjusting (changing) the resistance value of the resistor element, it is unnecessary to change masks (exposure masks) for forming the contacts 8 and masks (exposure masks) for forming the electrodes (wirings) 10. In this embodiment, it is possible to change (adjust) the resistance value $R_0$ of the resistor element by changing the area of the silicide layer 5 to move the position of the end 5a of the silicide layer 5 without changing the shape (pattern shape) of the poly-Si layer 3 of the resistor element.

In this embodiment, the area of the silicide layer 5 is reduced (and the position of the end 5a of the silicide layer 5 is moved away from the end 4a of the silicide layer 4) to increase the resistance value of the resistor element, and the area of the silicide layer 5 is increased (and the position of the end 5a of the silicide layer 5 is moved close to the end 4a of the silicide layer 4) to reduce the resistance value of the resistor element. The variation of the resistance value of the resistor element from the design value greatly influences the characteristics of the semiconductor device (semiconductor integrated circuit device). However, it is difficult to achieve the resistance value consistent with the design value at the initial step of making a prototype. Therefore, after making a prototype of the circuit (semiconductor device) and evaluating the characteristics thereof, the resistance value of the resistor element is adjusted, whereby it becomes possible to manufacture the semiconductor device with desired characteristics and performance. It is not easy in the step of forming the prototype to determine whether the resistance value of the resistor element is to be increased or reduced later. Therefore, it is preferable that the area of one silicide layer 5 is formed to have a relatively large area in the step of forming a prototype so that the resistance value of the resistor element can be adjusted by increasing or reducing the area of the silicide layer 5 after the characteristic evaluation. By so doing, the degree of freedom (design freedom) in the change of the resistance value of the resistor element is increased. How much the area of the silicide layer 5 is made larger in comparison to the area of the silicide layer 4 can be determined based on the amount of change (amount to be changed) in the resistance value of the resistor element. However, it is preferable to set the length $L_2$ (that is, the absolute value of the difference between the length $L_4$ and the length $L_3$) to be 5% or more of the length $L_1$ (closest length) between the silicide layer 4 and the silicide layer 5 (that is, $(L_2/L_1) \times 100 \geqq 5$), and is more preferable to set the length $L_2$ to be 10% or more of the length $L_1$. In this manner, it becomes possible to appropriately adjust the resistance value of the resistor element to a desired value, and thus possible to achieve the manufacture (mass production) of the semiconductor device with desired characteristics more easily.

As described above, according to this embodiment, the area of the silicide layer 5 is made larger than that of the silicide layer 4. Therefore, the length between one end 3b (shorter side of the poly-Si layer 3 on the side close to the silicide layer 5) of the poly-Si layer 3 constituting the resistor element and the end 5a of the silicide layer 5 on the side facing to the silicide layer 4 is made longer than the length between the other end 3a (shorter side of the poly-Si layer 3 on the side close to the silicide layer 4) of the poly-Si layer 3 constituting the resistor element and the end 4a of the silicide layer 4 on the side facing to the silicide layer 5. Also, by changing the position of the end 5a of the silicide layer 5 facing to the silicide layer 4, the length $L_1$ (closest length) between the silicide layers 4 and 5 is adjusted, whereby the resistance value of the resistor element can be adjusted to a desired value. As described above, the difference (corresponding to $L_2$) (or the absolute value of the difference) between the length (corresponding to $L_4$) between the end 3b of the poly-Si layer 3 constituting the resistor element and the end 5a of the silicide layer 5 and the length (corresponding to $L_3$) between the end 3a of the poly-Si layer 3 constituting the resistor element and the end 4a of the silicide layer 4 is preferably set to 5% or more of the length (closest length) between the silicide layers 4 and 5, and more preferably set to 10% or more thereof. In this manner, it becomes possible to appropriately adjust the resistance value of the resistor element to a desired value, whereby it is possible to achieve the manufacture (mass production) of the semiconductor device with desired characteristics more easily.

Next, the manufacturing process of the resistor element according to this embodiment shown in FIGS. 1 and 2 will be described. FIGS. 3 to 10 are sectional views showing the principal part of the resistor element in the manufacturing process according to this embodiment.

Figure 3:
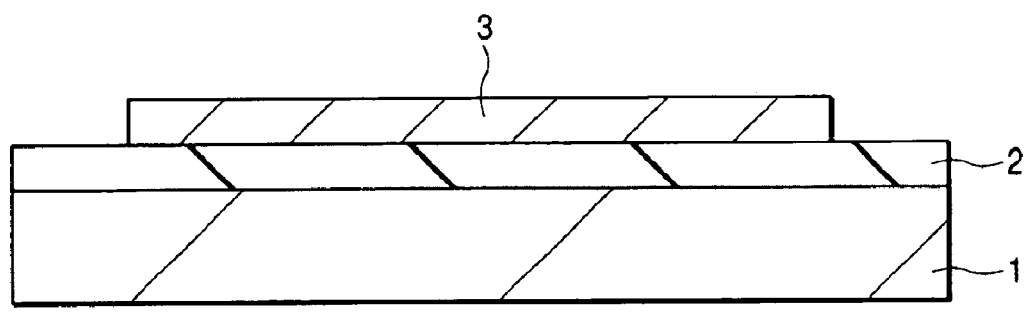
FIG. 3 is a sectional view showing the principal part of a resistor element in a manufacturing process according to an embodiment of the present invention.

First, as shown in FIG. 3, an insulator 2 made of, for example, a silicon oxide layer is formed on a semiconductor substrate (semiconductor wafer) 1 made of p type single crystal silicon having a specific resistance of approximately 1 to 10 Ωcm. The insulator 2 can be formed by, for example, a CVD (Chemical Vapor Deposition) method or an oxidation process (thermal oxidation method) or the like, and it has a thickness of, for example, approximately 350 nm. Also, a distance for isolation formed by a STI (Shallow Trench Isolation) method or a LOCOS (Local Oxidization of Silicon) method or the like may be used as the insulator 2.

Next, a poly-Si (polysilicon) layer 3 is deposited (formed) on the insulator 2 by, for example, the CVD method or the like. The thickness of the poly-Si layer 3 is, for example, approximately 200 nm. Then, an impurity is introduced into the poly-Si layer 3 by the use of the ion implantation (ion injection) or the like in order to adjust the sheet resistance of the poly-Si layer 3. For example, boron (B) or the like is ion-implanted into the poly-Si layer 3 with an implantation amount (dose amount) of $1.5 \times 10^{15}/cm^2$ and an energy condition (implantation energy) of 25 keV.

Next, the poly-Si layer 3 is patterned (processed) by the use of a photolithography method and a dry etching method. More specifically, after forming a photoresist layer on the poly-Si layer 3, the photoresist layer is exposed and developed by the use of an exposure mask. By so doing, a photoresist pattern not shown is formed on the poly-Si layer 3. Then, the poly-Si layer 3 is dry-etched with using the photoresist pattern as an etching mask, thereby patterning the poly-Si layer 3 into a predetermined pattern. Thereafter, the photoresist pattern is removed by the ashing or the like. In this manner, the poly-Si layer 3 is patterned into a predetermined (desired) shape, and thus the structure as shown in FIG. 3 is obtained.

Figure 4:
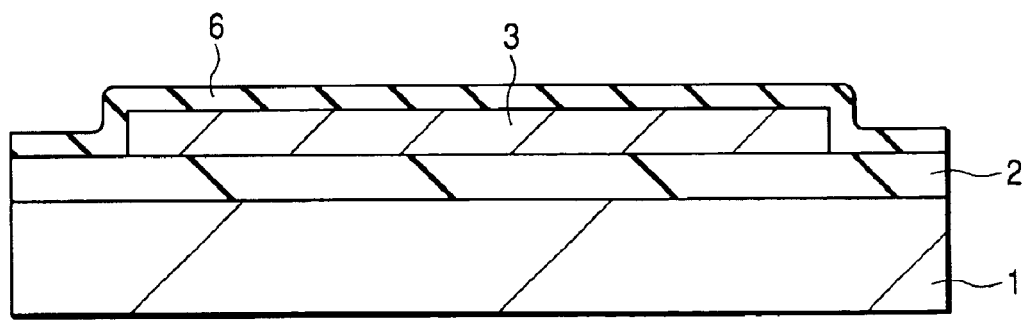
FIG. 4 is a sectional view showing the principal part of the resistor element in the manufacturing process subsequent to FIG. 3.

Next, as shown in FIG. 4, an insulator 6 made of, for example, a silicon nitride layer or a silicon oxide layer or the like is formed over the semiconductor substrate 1 so as to cover the patterned poly-Si layer 3. The insulator 6 can be formed by, for example, the CVD method, and the thickness of the insulator 6 is, for example, approximately 100 nm.

Figure 5:
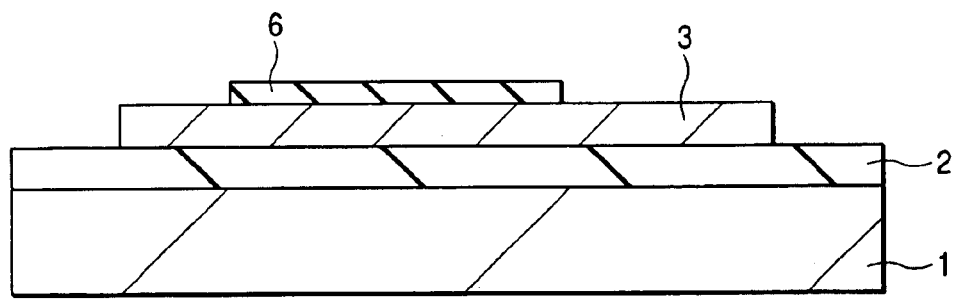
FIG. 5 is a sectional view showing the principal part of the resistor element in the manufacturing process subsequent to FIG. 4.

Next, as shown in FIG. 5, the insulator 6 is patterned by the use of the photolithography method and the dry etching method. At this time, the insulator 6 is patterned so that the insulator 6 is left in a region located on the upper surface of the poly-Si layer 3 where the silicide layers 4 and 5 are not formed and so that the insulator 6 is not left (the insulator 6 is removed) in the other region on the upper surface of the poly-Si layer 3, that is, in the region where the silicide layers 4 and 5 are to be formed. If the shape of the patterned insulator 6 is changed by changing the mask used in the exposure process (exposure mask) for forming the photoresist pattern not shown which is used as an etching mask, the positions where the silicide layers 4 and 5 on the poly-Si layer 3 are to be formed can be changed and thus the resistance value of the resistor element to be formed can be adjusted. After the patterning of the insulator 6, a thermal treatment at, for example, 1000° C. for approximately 1 second is performed to activate the impurity ion-implanted into the poly-Si layer 3.

Figure 6:
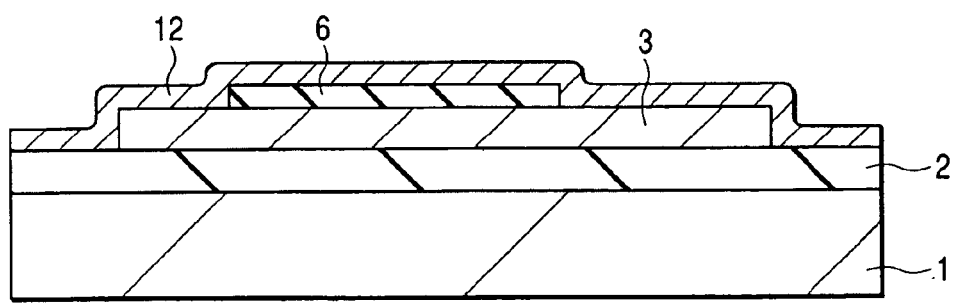
FIG. 6 is a sectional view showing the principal part of the resistor element in the manufacturing process subsequent to FIG. 5.

Next, as shown in FIG. 6, a metal layer 12 made of a cobalt layer or the like is deposited on the semiconductor substrate 1 so as to cover the poly-Si layer 3 and the insulator 6. The metal layer 12 can be formed by, for example, the sputtering method, and the thickness of the metal layer 12 is, for example, approximately 10 nm.

Figure 7:
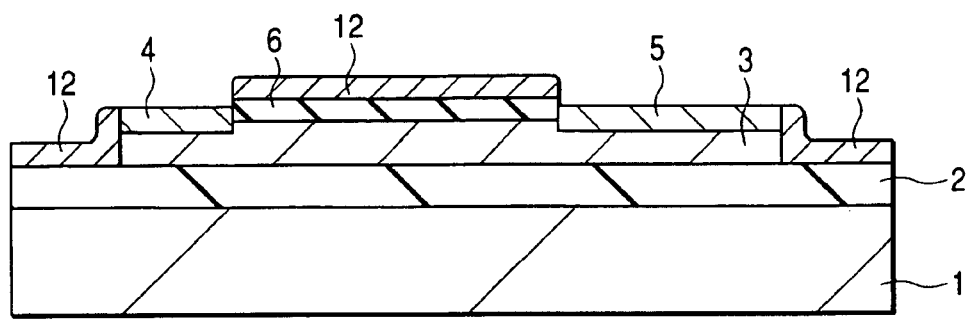
FIG. 7 is a sectional view showing the principal part of the resistor element in the manufacturing process subsequent to FIG. 6.

Next, as shown in FIG. 7, the thermal treatment at approximately 500° C. for approximately 60 seconds is performed in a nitrogen atmosphere. By so doing, parts of the poly-Si layer 3, which are not covered with the insulator 6, and the metal layer 12 contacting to the parts are reacted to form the silicide layers 4 and 5 (salicide layer). For example, in the case where the metal layer 12 is made of a cobalt layer, a cobalt silicide layer is formed as the silicide layers 4 and 5. Each thickness of the silicide layers 4 and 5 is, for example, approximately several tens nm, and the unreacted poly-Si layer 3 is left below the silicide layers 4 and 5.

Figure 8:
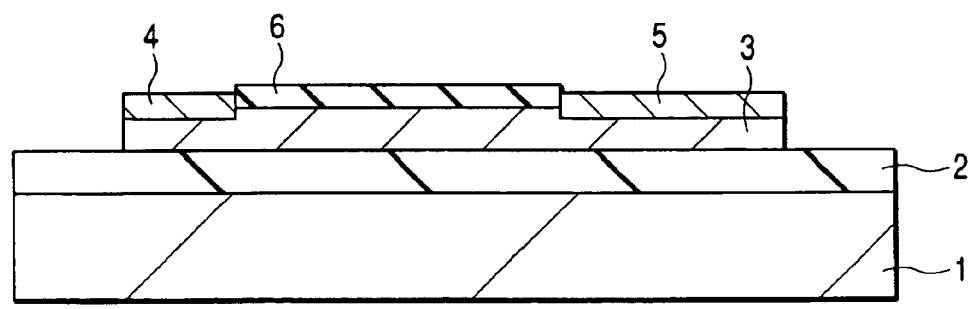
FIG. 8 is a sectional view showing the principal part of the resistor element in the manufacturing process subsequent to FIG. 7.

Next, as shown in FIG. 8, the unreacted metal layer 12 is removed by a wet etching method or the like, and the silicide layers 4 and 5 are left on the poly-Si layer 3.

Figure 9:
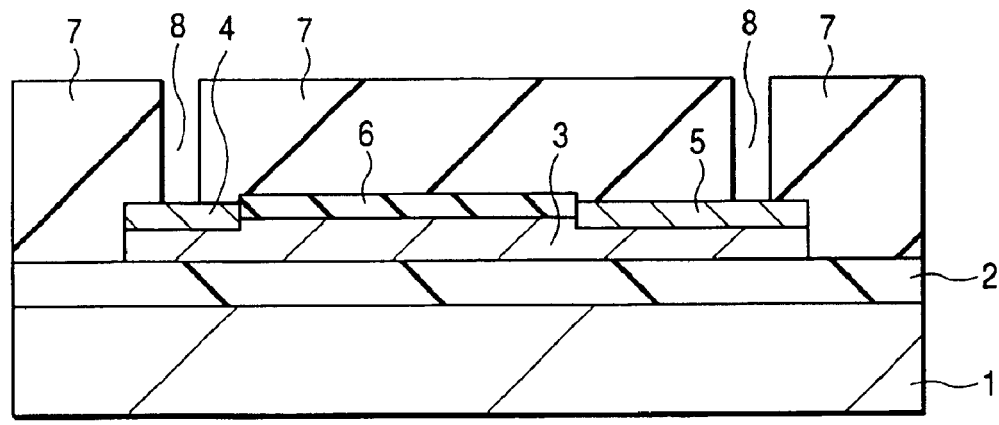
FIG. 9 is a sectional view showing the principal part of the resistor element in the manufacturing process subsequent to FIG. 8.

Next, as shown in FIG. 9, an insulator 7 is formed over the semiconductor substrate 1 so as to cover the poly-Si layer 3, the insulator 6, and the silicide layers 4 and 5. For example, as the insulator 7, there may be used: a single layer structure of a silicon oxide layer or the like; or a laminated layer of a relatively thin silicon nitride layer (with a thickness of, for example, approximately 100 nm) and a relatively thick silicon oxide layer (with a thickness of, for example, approximately 1300 nm).

Next, if necessary, the upper surface of the insulator 7 is planarized by using the CMP (Chemical Mechanical Polishing) method. Then, the insulator 7 is selectively removed by the use of the photolithography method and the dry etching method to form contacts 8 in the insulator 7. The parts of the silicide layers 4 and 5 are exposed at the bottom of the contacts 8.

Figure 10:
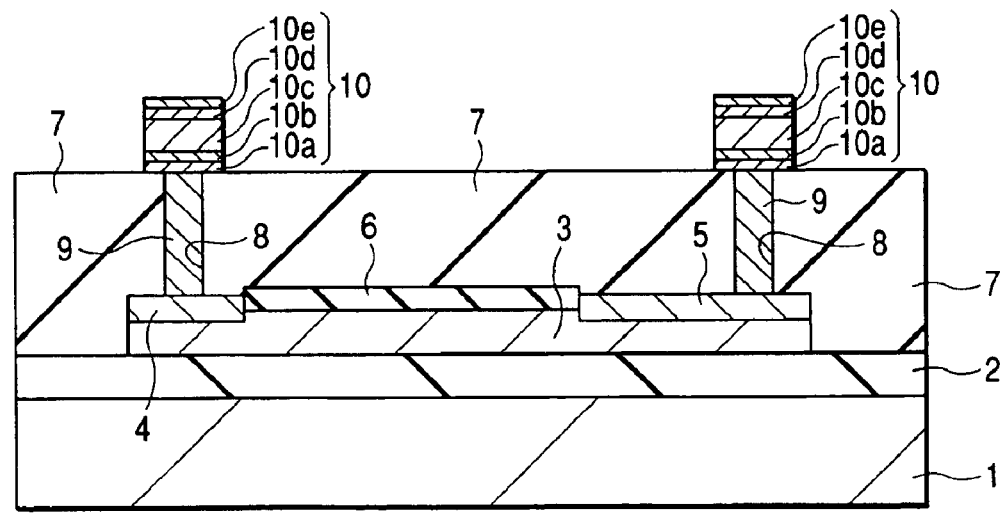
FIG. 10 is a sectional view showing the principal part of the resistor element in the manufacturing process subsequent to FIG. 9.

Next, as shown in FIG. 10, plug contacts 9 made of tungsten (W) are formed in the contacts 8. The plug contacts 9 are formed in the manner as follows. That is, after forming a titanium nitride layer as a barrier layer on the insulator 7 and inside the contacts 8, a tungsten layer is formed on the titanium nitride layer by the CVD (Chemical Vapor Deposition) method so as to bury the contacts 8 and, then, the unnecessary tungsten layer and the titanium nitride layer on the insulator 7 are removed by the CMP (Chemical Mechanical Polishing) method and the etch back method, etc.

Next, electrodes (wirings) 10 are formed on the insulator in which the plug contacts 9 are buried. For example, a refractory metal layer such as a titanium layer 10*a*; a refractory metal nitride layer such as a titanium nitride layer 10*b*; a simple substance of aluminum (Al) or a conductor layer containing aluminum as a main component such as an aluminum alloy, that is, an aluminum layer 10*c*; a refractory metal layer such as a titanium layer 10*d*; and a refractory metal nitride layer such as a titanium nitride layer 10*e* are sequentially formed on the insulator 7 in which the plug contacts 9 are buried, and then these layers are processed into a predetermined pattern by the photolithography method or the like to form the electrodes (wirings) 10. The electrodes (wirings) 10 are electrically connected to the silicide layers 4 and 5 through the plugs 9. The electrode (wiring) 10 is not limited to the above-mentioned aluminum wiring (electrode) and can be variously modified and altered. For example, the aluminum wiring (electrode) composed of a single layer of aluminum (Al) or aluminum alloy, the tungsten wiring (electrode), or the copper wiring (electrode) are also available as the electrode (wiring) 10. In this manner, the resistor element according to this embodiment is formed. Thereafter, an interlayer insulator is formed so as to cover the electrodes (wirings) 10, and the through holes and the plugs buried therein are formed as occasion demands, and furthermore an upper layer wiring electrically connected to the electrode (wiring) 10 is formed. However, the description thereof will be omitted here.

Figure 11:
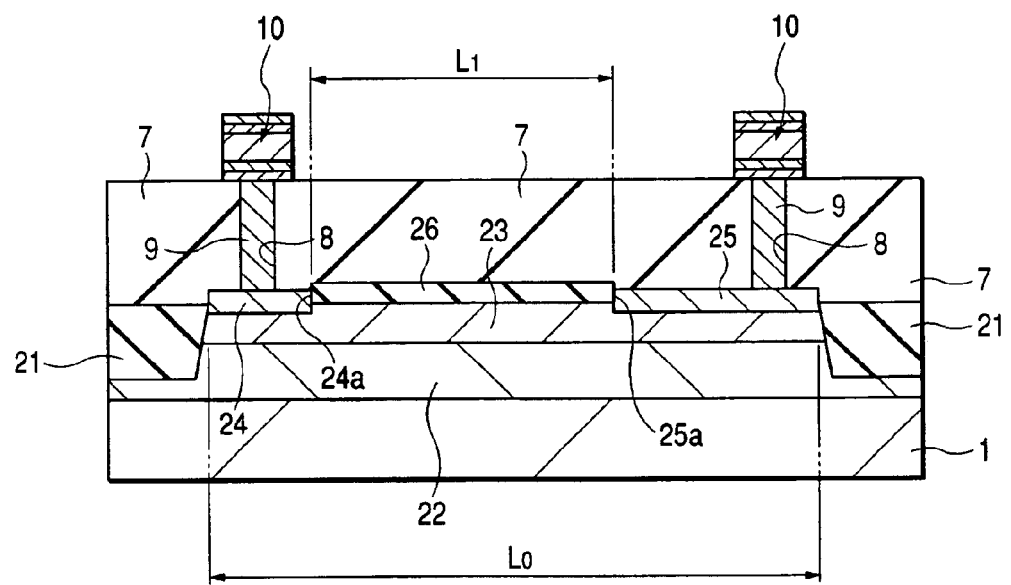
FIG. 11 is a sectional view showing a resistor element formed of an impurity diffusion layer formed by introducing an impurity into the semiconductor substrate.

In the resistor element shown in FIG. 1, the poly-Si layer 3 is used as the silicon layer constituting the resistor element. In another example, the resistor element may be formed using a diffusion (impurity-introduced single crystal silicon layer) formed by introducing an impurity into the semiconductor substrate (by means of the ion implantation or the like) instead of the poly-Si layer 3. FIG. 11 is a sectional view of the resistor element formed by the use of the diffusion formed by introducing an impurity into the semiconductor substrate 1, in which the section corresponding to FIG. 1 is shown.

As shown in FIG. 11, distances for isolation 21 made of silicon oxide are formed in the semiconductor substrate 1 made of p type single crystal silicon by, for example, the STI (Shallow Trench Isolation) method or the LOCOS (Local Oxidization of Silicon) method, and an n type well 22 is formed by, for example, the ion implantation of an impurity such as phosphorus. Then, an impurity such as phosphorus is ion-implanted (introduced) into the n type well 22, thereby forming a p type semiconductor (diffusion) 23. By this p type semiconductor 23, the resistor element is formed. In the vicinity of both ends of the p type semiconductor 23 which forms the resistor element, silicide layers 24 and 25 similar to the silicide layers 4 and 5 formed on the upper surface of the poly-Si layer 3 shown in FIG. 1 are formed on the surface (upper surface) of the p type semiconductor 23 in the same manner as that of the silicide layers 4 and 5. The regions on the upper surface of the p type semiconductor 23 and in which the silicide layers 24 and 25 are not formed are covered with an insulator 26. Since the other components (insulator 7, contact 8, plug contact 9, and electrode 10) are almost equivalent to those in the resistor element shown in FIG. 1, the description thereof will be omitted here. Also in the case of the resistor element shown in FIG. 11, the area of silicide layer 25 is set to be larger than that of the silicide layer 24, and the position of the end (the end on the side facing to the silicide layer 24) 25*a* of the silicide layer 25 is changed by adjusting the area of the silicide layer 25 in the same manner as that in the case of the resistor element shown in FIG. 1. By so doing, it becomes possible to adjust the length $L_1$ between the end (end on the side facing to the silicide layer 25) 24*a* of the silicide layer 24 and the end 25*a* of the silicide layer 25 (that is, the length of the p type semiconductor 23 sandwiched between the silicide layers 24 and 25), whereby the resistance value of the resistor element can be adjusted to a desired value.

As described above, the resistance value of the resistor element adopting a silicide (salicide) structure is composed of the resistance value of the resistive element (silicon layer, poly-Si layer, and single crystal silicon layer) sandwiched between the silicide layers, and the connection resistance of the contacts connected to the silicide layers. In this embodiment, the resistance value of the resistive elements (silicon layer, for example, poly-Si layer, or single crystal silicon layer to which an impurity is introduced) sandwiched between silicide layers is changed by changing the areas of the silicide layers, whereby the resistance value of the resistor element can be adjusted. Therefore, there can be provided the resistor element capable of changing the resistance value thereof without changing the dimensions (size). Generally, it is unnecessary to change the mask (exposure mask) used to form the resistive elements that are formed simultaneously with the transistor. Additionally, it is possible to reduce the time required for the manufacture of the circuit (semiconductor integrated circuit device, semiconductor device) that mounts the resistor element whose the resistance value is adjusted.

Also, it becomes possible to realize the semiconductor device (semiconductor integrated circuit device) adopting a gate array system in which the desired circuit is constituted (formed) in such a manner that the resistive element forming the resistor element and the transistor are formed in advance before the circuit designing and that the mask for forming (processing) the silicide layer (exposure mask) and the mask for forming (processing) the wiring layer (exposure mask) are formed after the circuit designing. This is because the resistance value of the resistive element (resistor element) can be adjusted by changing the mask (exposure mask) for forming the silicide layer.

Furthermore, according to this embodiment, it is possible to reduce the number of masks (exposure mask) required for changing the resistance value of the resistor element and also to reduce the cost required for changing the mask (exposure mask). This is because the resistance value of the resistive element (resistor element) can be adjusted by changing the mask (exposure mask) for forming the silicide layer.

The resistor element according to this embodiment may be formed also in the manufacturing process of other semiconductor devices (for example, a bipolar transistor or MISFET). For example, the poly-Si layer constituting the resistor element in the semiconductor device can be formed of the same layer as the poly-Si layer constituting the base electrode of the bipolar transistor in the semiconductor device. The manufacturing process of such a semiconductor device will be described with reference to the drawings. FIGS. 12 to 16 are sectional views showing the principal part of the semiconductor device (semiconductor integrated circuit device) in the manufacturing process according to this embodiment. Note that the semiconductor device whose a manufacturing process is described here is provided with, for example, a resistor element, a bipolar transistor, an n type MISFET (Metal Insulator Semiconductor Field Effect Transistor), and a p type MISFET.

Figure 12:
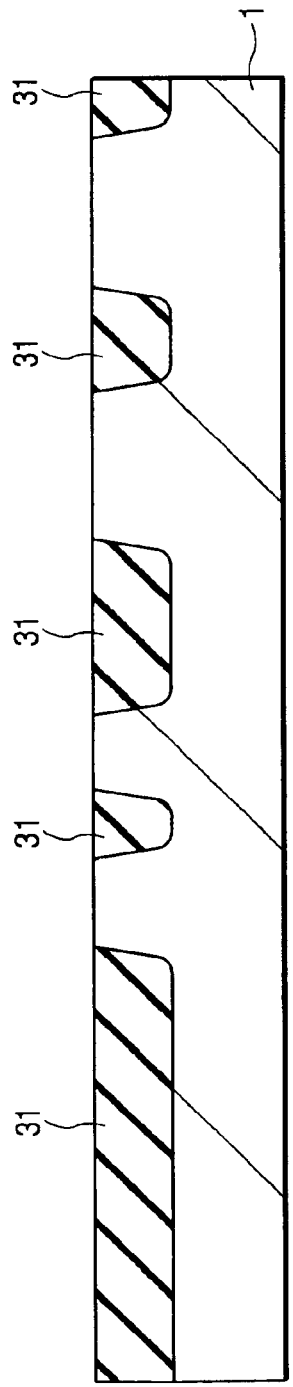
FIG. 12 is a sectional view showing the principal part of the semiconductor device in the manufacturing process according to an embodiment of the present invention.

As shown in FIG. 12, distances for isolation 31 are formed on the main surface of the semiconductor substrate (semiconductor wafer) 1 made of p type single crystal silicon with a specific resistance of approximately 1 to 10 Ωcm. The distances for isolation 31 are made of, for example, silicon oxide and by the STI (Shallow Trench Isolation) method or the LOCOS (Local Oxidization of Silicon) method or the like. For example, trenches for device isolation are formed in the semiconductor substrate 1, and then the silicon oxide layer is buried in the trenches. Thereafter, the silicon oxide layer is planarized by the CMP method or the like. In this manner, the distances for isolation 31 can be formed.

Figure 13:
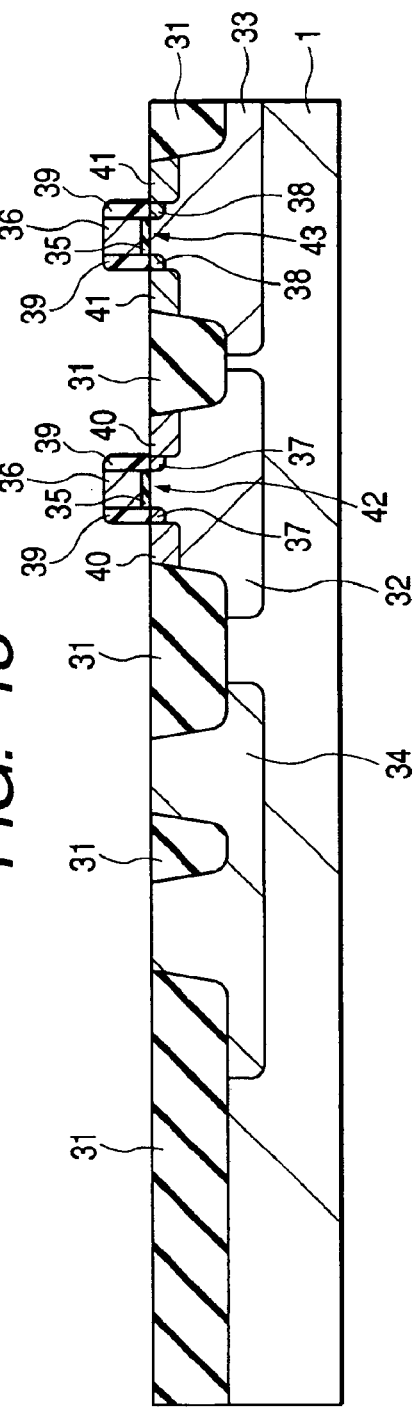
FIG. 13 is a sectional view showing the principal part of the semiconductor device in the manufacturing process subsequent to FIG. 12.

Next, as shown in FIG. 13, a p type well 32 and n type wells 33 and 34 extending from the main surface of the semiconductor substrate 1 to the predetermined depth are formed in the semiconductor substrate 1. The p type well 32 is formed by the ion implantation of an impurity such as boron, and the n type wells 33 and 34 are each formed by the ion implantation of an impurity such as phosphorus.

Next, the MISFET (Metal Insulator Semiconductor Field Effect Transistor) is formed in a MISFET forming region. First, a gate insulator 35 is formed on the surfaces of the p type well 32 and the n type well 33. The gate insulator 35 is made of, for example, a thin silicon oxide layer and can be formed by, for example, the thermal oxidation method.

Next, a gate electrode 36 is formed on each of the gate insulators 35 of the p type well 32 and the n type well 33. For example, a poly-Si (polysilicon) layer is formed on the semiconductor substrate 1, and then impurities are ion-implanted into the poly-Si layer (for example, phosphorus (P) is ion-implanted into the n type MISFET forming region, and boron (B) is ion-implanted into the p type MISFET forming region) to form the low-resistance semiconductor layer. Thereafter, the poly-Si layer is patterned (processed) by the photolithography method and the dry etching method. By so doing, the gate electrode 36 made of the poly-Si layer can be formed.

Next, since an impurity such as phosphorus is ion-implanted into regions located on both sides of the gate electrode 36 of the p type well 32, an n⁻ source/drain regions (diffusions) 37 is formed, and since an impurity such as boron is ion-implanted into regions located on both sides of the gate electrode 36 of the n type well 33, a p⁻ source/drain regions (diffusions) 38 is formed.

Next, sidewall spacers or LDD sidewalls 39 made of, for example, silicon oxide are formed on sidewalls of the gate electrode 36. The LDD sidewall 39 is formed by, for example, depositing a silicon oxide layer over the semiconductor substrate 1 and then performing the anisotropic etching to the silicon oxide layer.

After forming the LDD sidewalls 39, an n⁺ type semiconductor (diffusion or source/drain) 40 is formed by the ion implantation of an impurity such as phosphorus into the regions located on both sides of the gate electrode 36 of the p type well 32 and on those of the LDD sidewall 39, and a p⁺ type semiconductor (diffusion or source/drain) 41 is formed by the ion implantation of an impurity such as boron into the regions located on both sides of the gate electrode 36 of the n type well 33 and on those of the LDD sidewall 39. The n⁺ type semiconductor 40 has the impurity concentration higher than that of the n⁻ source/drain regions 37 and the p⁺ type semiconductor 41 has the impurity concentration higher than that of the p⁻ type source/drain region 38, whereby a LDD (Lightly Doped Drain) structure is formed.

The n type MISFET 42 and the p type MISFET 43 are thus formed.

Next, the bipolar transistor is formed in a bipolar-transistor forming region. Note that, in the MISFET forming region (in which the n type MISFET 42 and the p type MISFET 43 are formed), material layers formed in a manufacturing process of the bipolar transistor can be removed in the patterning process of the material layers.

Figure 14:
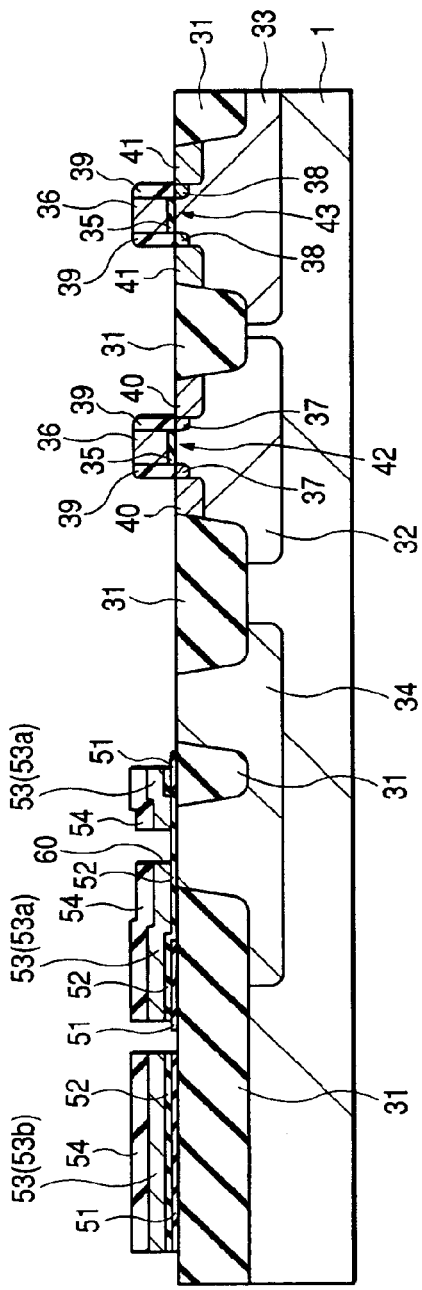
FIG. 14 is a sectional view showing the principal part of the semiconductor device in the manufacturing process subsequent to FIG. 13.

First, as shown in FIG. 14, an insulator 51 made of, for example, a silicon oxide layer is formed (deposited) over the semiconductor substrate 1. The thickness of the insulator 51 is, for example, approximately 100 nm. Then, the insulator 51 is patterned by the photolithography method and the dry etching method to open a region where the bipolar transistor is to be formed.

Next, an insulator 52 is formed over the semiconductor substrate 1. The insulator 52 is made of, for example, a single layer of a silicon nitride layer, or a laminated layer of a silicon oxide layer and a silicon nitride layer. The thickness of the insulator 52 is, for example, approximately 60 nm. Then, a poly-Si (polysilicon) layer 53 used to form the resistor element and a base electrode of the bipolar transistor in common is deposited over the semiconductor substrate 1. The thickness of the poly-Si silicon layer 53 is, for example, approximately 150 nm. Then, an impurity is introduced into the poly-Si layer 53 by the use of the ion implantation or the like so as to adjust the sheet resistance of the poly-Si layer 53. At this time, the ion-implantation condition is, for example, that boron (B) is ion-implanted into the poly-Si layer 53 with the implantation amount (dose amount) of approximately $1.5 \times 10^{15}/cm^2$ and the energy condition (implantation energy) of approximately 25 keV. Note that, by performing the ion implantation to the whole of the poly-Si layer 53, the sheet resistance of the part of the poly-Si layer 53 constituting the resistor element can be set equal to the resistance value of the part of the poly-Si layer 53 constituting the base electrode. However, the sheet resistance of the part of the poly-Si layer 53 constituting the resistor element can also be set different from that of the part of the poly-Si layer 53 constituting the base electrode by changing the conditions (kind of the impurity, the implantation amount, or the implantation energy) of the ion implantation for each of the regions of the poly-Si layer 53 where the resistor element is to be formed and where the base electrode of the bipolar transistor is to be formed.

Next, an insulator 54 is formed over the semiconductor substrate 1. The insulator 54 is made of, for example, a single layer of a silicon nitride layer with a thickness of approximately 200 nm or a laminated layer of a silicon nitride layer with a thickness of approximately 50 nm and a silicon oxide layer with a thickness of approximately 200 nm. Then, the insulator 54 and the poly-Si layer 53 are patterned (processed) by the use of the photolithography method and the dry etching method, whereby there are formed the base electrode (base extension electrode) 53a of the bipolar transistor and the poly-Si (polysilicon) layer 53b for resistor element. In this manner, the structure shown in FIG. 14 is obtained.

Next, a sidewall insulator (sidewall spacer) 61 is formed on a sidewall of a hole for emitter 60 of the insulator 54 and the poly-Si silicon layer 53, the hole for emitter in which the base region of the bipolar transistor is to be formed, and then the insulator 52 is etched and removed at the bottom of the hole for emitter 60. At this time, side-etching of the insulator 52 is done at the bottom of the hole for emitter 60. Thereafter, a base region 62 made of, for example, silicon germanium is formed by the use of a epitaxial crystal growth method or the like. The base region 62 may be formed by the use of the ion implantation method. Then, as occasion demands, an n type semiconductor 63 is formed by the ion implantation method or the like. Thereafter, after a sidewall (second sidewall) is further formed on the sidewall-insulator 61 to increase the thickness of the sidewall insulator 61, a poly-Si (polysilicon) layer used to form an emitter electrode (emitter extraction electrode) 64 of the bipolar transistor and containing an impurity such as phosphorus (P) or arsenic (As) is deposited over the semiconductor substrate 1. Subsequently, the poly-Si layer and the insulator 54 are patterned by the use of the photolithography method and the dry etching method to form the emitter electrode (emitter extraction electrode) 64. Then, for example, the thermal treatment for approximately 1 second at approximately 1000° C. is performed to diffuse the impurity into the base region 62 from the poly-Si layer constituting the emitter electrode 64. By so doing, the emitter region 64 of the bipolar transistor is formed. Note that, in another embodiment, a poly-Si layer 53b constituting the resistor element can be formed by the poly-Si layer which constitutes the emitter electrode 64 but not the base electrode 53a, and the poly-Si layer 53b constituting the resistor element may be formed by the same layer as the poly-Si layer constituting the emitter electrode 64 of the bipolar transistor.

Figure 15:
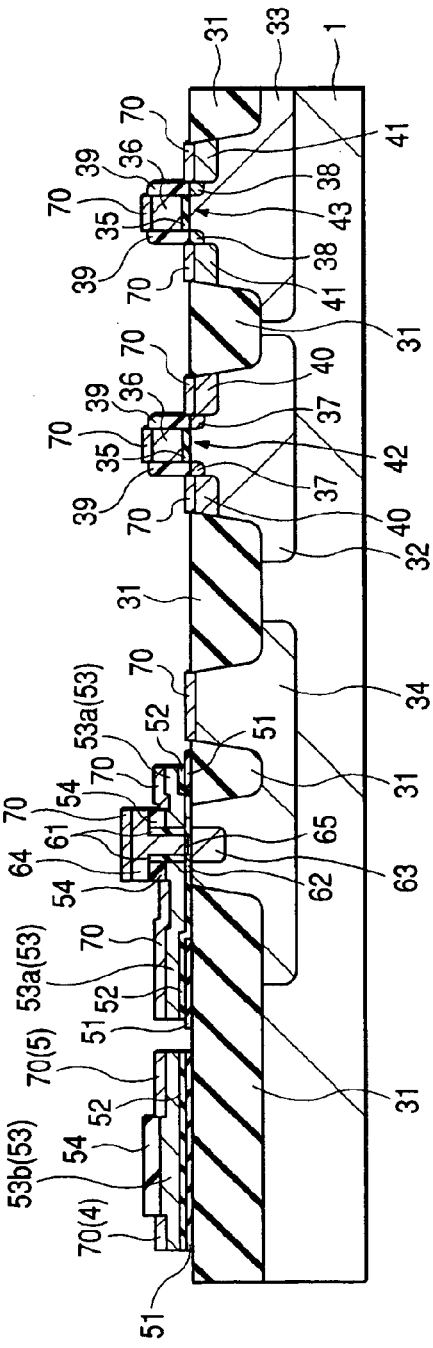
FIG. 15 is a sectional view showing the principal part of the semiconductor device in the manufacturing process subsequent to FIG. 14.

Next, by the photolithography method and the dry etching method, the insulator 54 is left only on a silicon region (poly-Si layer or single crystal silicon layer) where the silicide layer is not to be formed, and the insulator 54 in the other regions is removed. Thereafter, a metal layer made of, for example, a cobalt layer or the like is deposited over the semiconductor substrate 1, and then the thermal treatment is performed to react the metal layer and the underlying silicon, whereby a silicide layer (salicide layer) 70 made of cobalt silicide is formed. Thereafter, the unreacted metal layer is removed by the wet etching or the like. By so doing, a silicide layer (salicide layer) 70 is formed on each of: the poly-Si layer 53b constituting the resistor element; the poly-Si layer constituting the base electrode 53a of the bipolar transistor; the poly-Si layer constituting the emitter electrode 64; the collector extension electrode; the poly-Si layer constituting the gate electrode 36 of the MISFET; and the diffusions serving as the source/drain (n⁺ type semiconductor 40 and p⁺ type semiconductor 41) In this manner, the structure shown in FIG. 15 is obtained.

Figure 16:
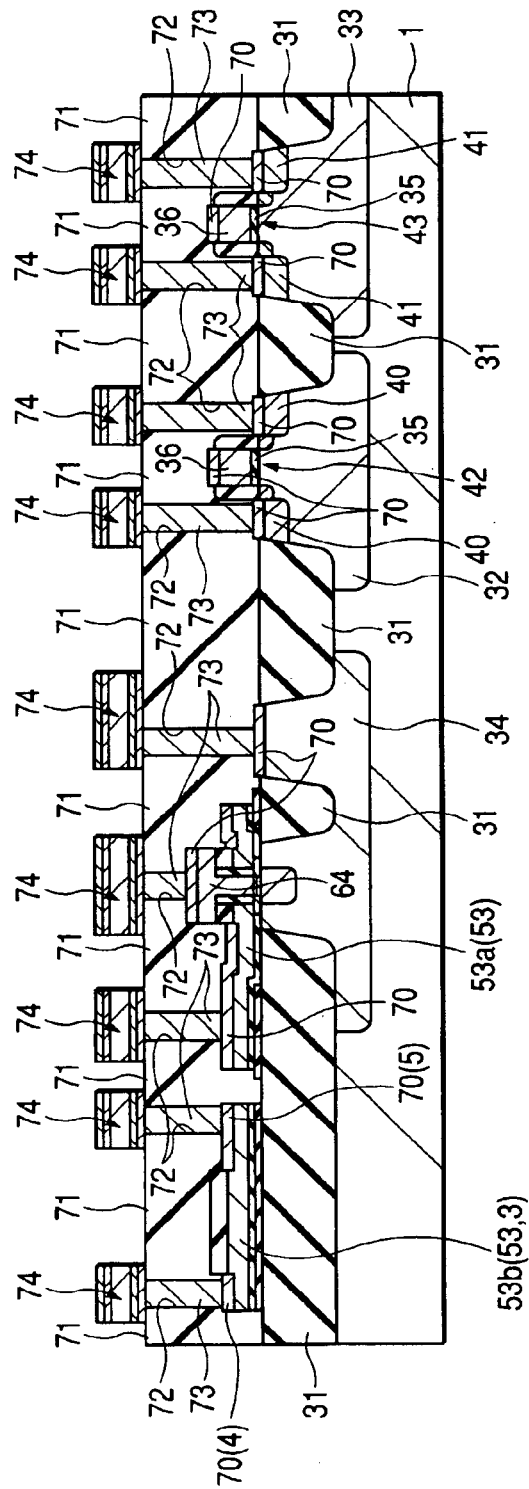
FIG. 16 is a sectional view showing the principal part of the semiconductor device in the manufacturing process subsequent to FIG. 15.

Thereafter, as shown in FIG. 16, an insulator 71 made of a silicon oxide layer (or a laminated layer of a relatively thin silicon nitride layer and a relatively thick silicon oxide layer) or the like is formed over the semiconductor substrate 1, and then contacts 72 are formed in the insulator 71 by the use of the photolithography method and the dry etching method. Thereafter, plug contacts 73 to be buried in the contacts 72 are formed, and electrodes (wirings) 74 electrically connected to the resistor element, the MISFET, or the bipolar transistor through the plug contacts 73 are formed on the insulator.

As described above, the semiconductor device (semiconductor integrated circuit device) having the resistor element, the bipolar transistor, and the MISFET can be manufactured. Note that the resistor element shown in FIG. 16 corresponds to that shown in FIG. 1. More specifically, the poly-Si layer 53b constituting the resistor element and the two silicide layers 70 formed thereon in FIG. 16 correspond to the poly-Si layer 3 and the silicide layers 4 and 5 in FIG. 1, respectively. Therefore, the area and the positional relationship of the two silicide layers 70, formed over the poly-Si layer 53b constituting the resistor element, are similar to those of the silicide layers 4 and 5 formed on the poly-Si layer 3 constituting the above-mentioned resistor element.

Since the poly-Si layer 53b constituting the resistor element of the semiconductor device is formed of the same layer as the poly-Si layer constituting the base electrode 53a of the bipolar transistor (or the poly-Si layer constituting the emitter electrode 64) of the semiconductor device, the resistor element can be also formed in the manufacturing process of the transistor. Therefore, it is possible to reduce, in number, the manufacture steps of the semiconductor device, and reduce the manufacturing cost of the semiconductor device.

In the foregoing embodiments, the poly-Si layer constituting the resistor element of the semiconductor device is formed of the same layer as the poly-Si layer constituting the base electrode of the bipolar transistor of the semiconductor device (or the poly-Si layer constituting the emitter electrode 64). However, in another embodiment, the poly-Si layer constituting the resistor element of the semiconductor device may be formed of the same layer as the poly-Si layer constituting the gate electrode of the MISFET of the semiconductor device.

Figure 17:
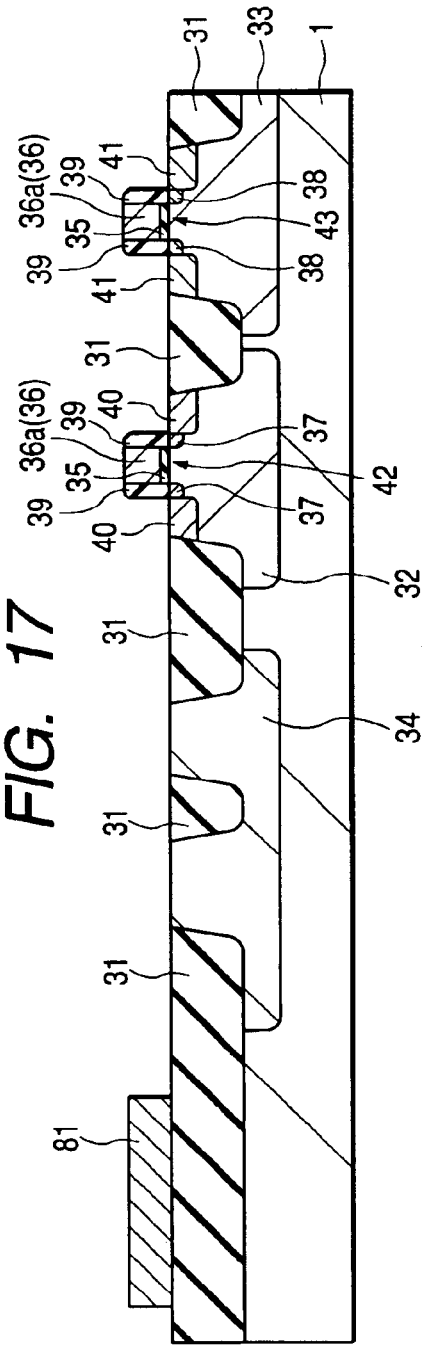
FIG. 17 is a sectional view showing the principal part of a semiconductor device in a manufacturing process according to another embodiment of the present invention.
Figure 18:
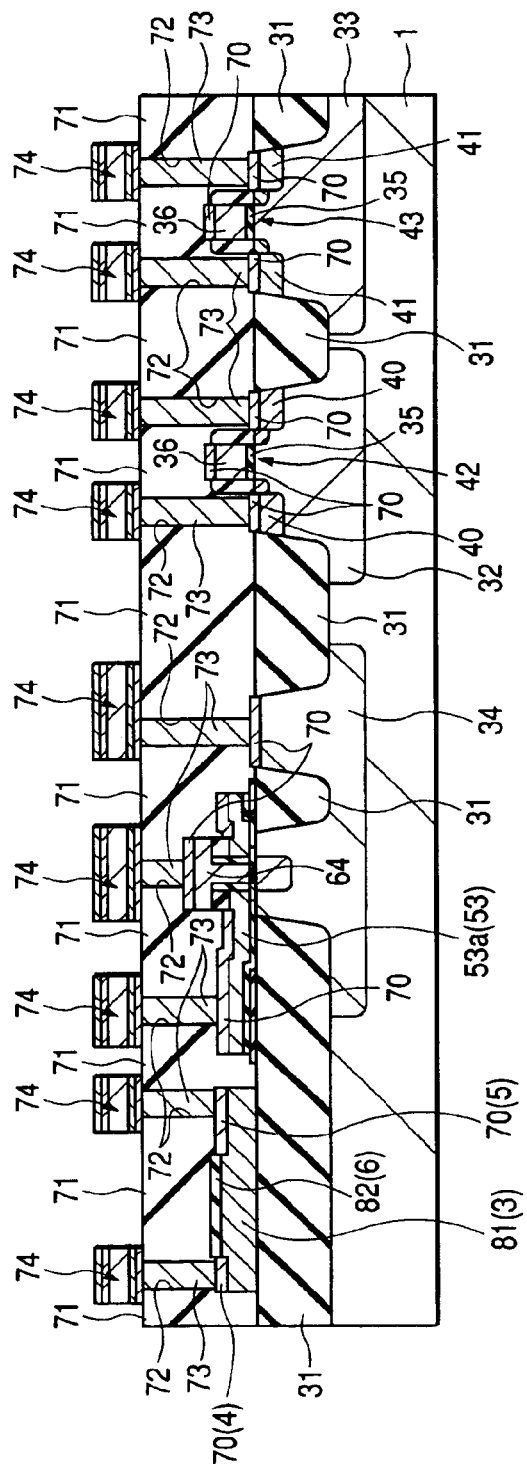
FIG. 18 is a sectional view showing the principal part of the semiconductor device in the manufacturing process subsequent to FIG. 17.

FIGS. 17 and 18 are sectional views showing the principal part of the semiconductor device in the manufacturing process thereof, in which the poly-Si layer constituting the resistor element of the semiconductor device is formed of the same layer as the poly-Si layer constituting the gate electrode of the MISFET of the semiconductor device.

As shown in FIG. 17, after a poly-Si (polysilicon) layer for forming the gate electrodes 36 of the n type MISFET and the p type MISFET is formed, the ion implantation of an impurity according to need is performed. Thereafter, at the time of patterning the poly-Si layer by the photolithography method and the dry etching method, the poly-Si layer is patterned so that a poly-Si (polysilicon) layer 81 constituting the resistor element can be left in a region where the resistor element is to be formed simultaneously with the poly-Si (polysilicon) layer 36a constituting the gate electrode 36. Therefore, the poly-Si layer 81 constituting the resistor element and the poly-Si layer 36a constituting each of the gate electrodes 36 of the n type MISFET and the p type MISFET are formed of the same poly-Si layer. Note that, by performing the ion implantation to the whole of the poly-Si layer, the sheet resistance of the poly-Si layer 81 constituting the resistor element can be set, in resistance value, equal to that of the poly-Si layer 36a constituting the gate electrode 36. However, the sheet resistance of the poly-Si layer 81 constituting the resistor element can also be set different from that of the poly-Si layer 36a constituting the gate electrode 36 by changing the conditions (kind of the impurity, the implantation amount, or the implantation energy) of the ion implantation for each of the region where the resistor element is to be formed and the region where the gate electrode of the MISFET is to be formed.

Next, after forming the n type MISFET 42 and the p type MISFET 43 by forming the LDD sidewalls 39 and the diffusions (n⁺ type semiconductor 40 and p⁺ type semiconductor 41) serving as the source/drain of the MISFET, the bipolar transistor is formed through almost the same process as that as shown in FIGS. 14 to 16, whereby the structure as shown in FIG. 18 is obtained. In this case, since the poly-Si layer 81 constituting the resistor element is already formed at the time when the gate electrode 36 of the MISFET is formed, it is unnecessary to form a poly-Si layer pattern for resistor element at the time of patterning the poly-Si layer 53 constituting the base electrodes 53*a* similarly to the above-mentioned embodiment. Note that an insulator 82 covering the region where the silicide layer is not to be formed is formed on the poly-Si layer 81. Thereafter, the silicide layer 70 is formed on each of: the poly-Si layer constituting the base electrode of the bipolar transistor; the poly-Si layers constituting the emitter electrode 64 and the collector extension region; the poly-Si layer constituting the gate electrode 36 of the MISFET; the diffusions serving as the source/drain (n⁺ type semiconductor 40 and p⁺ type semiconductor 41); and the poly-Si layer 81 constituting the resistor element.

The structure shown in FIG. 18 almost corresponds to that shown in FIG. 16 except that the resistor element is formed using both of the poly-Si layer constituting the gate electrode 36 of the MISFET and the poly-Si layer 81 located on the same layer as it. Additionally, the resistor element formed in FIG. 18 corresponds to that in FIG. 1, and the area and the positional relationship of the two silicide layers 70 formed on the poly-Si layer 81 constituting the resistor element are the same as those of the silicide layers 4 and 5 formed on the poly-Si layer 3 constituting the resistor element.

The poly-Si layer 81 constituting the resistor element of the semiconductor device is formed of the same layer as the poly-Si layer 36*a* constituting the gate electrode 36 of the MISFET of the semiconductor device. Therefore, the resistor element can be also manufactured in the manufacturing steps of the MISFET, whereby it becomes possible to reduce the number of manufacture steps of the semiconductor device and also reduce the manufacturing cost of the semiconductor device.

Figure 19:
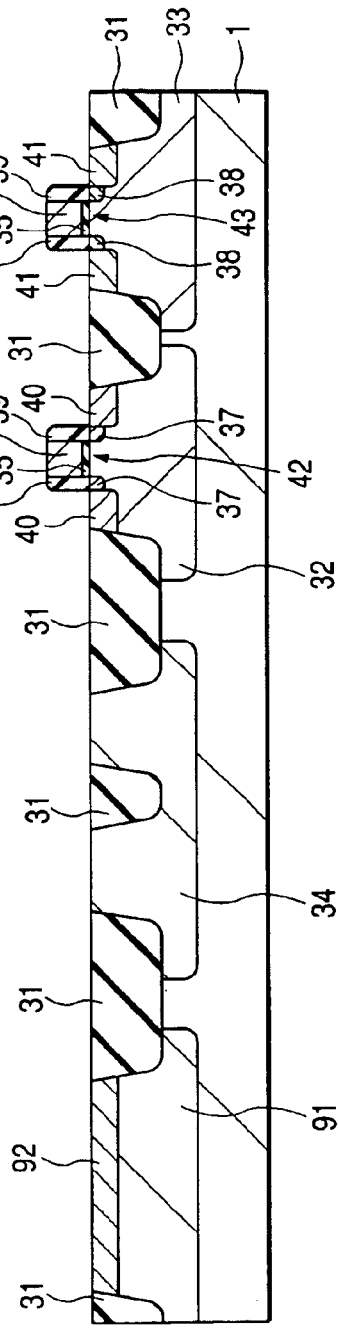
FIG. 19 is a sectional view showing the principal part of a semiconductor device in a manufacturing process according to another embodiment of the present invention.
Figure 20:
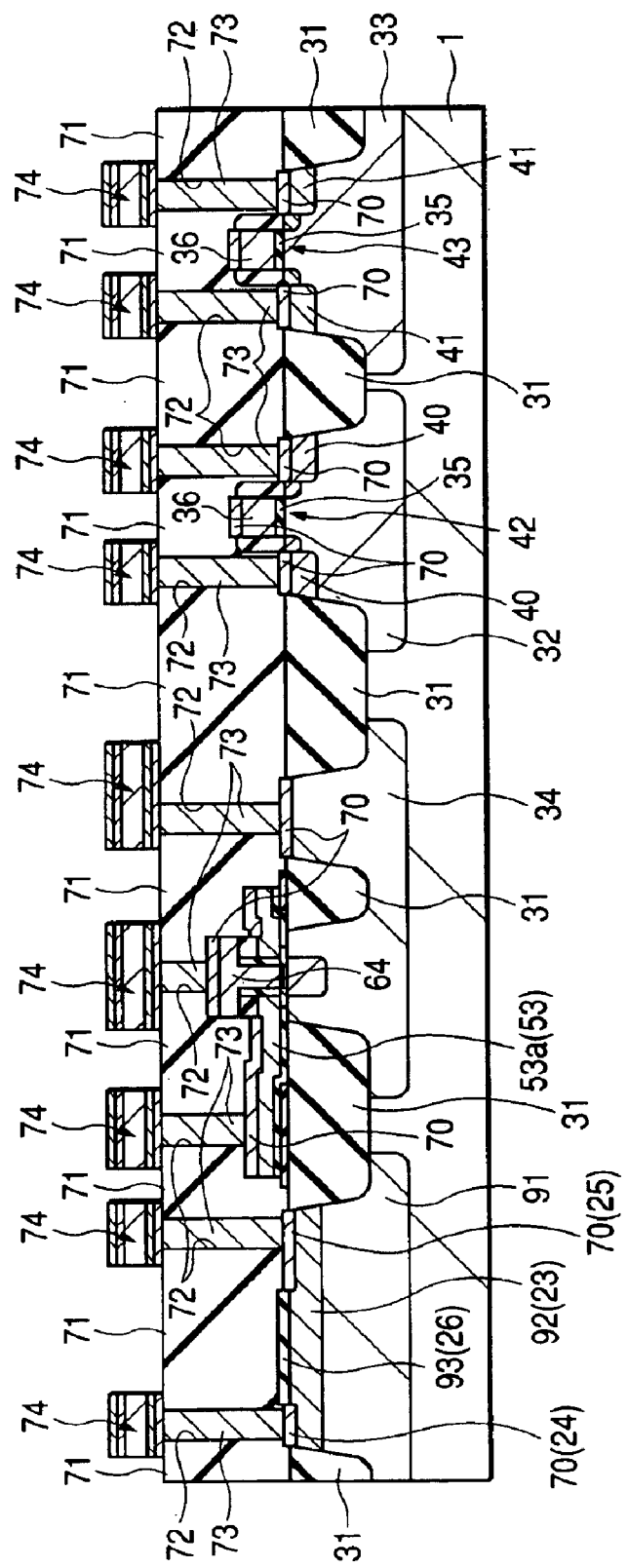
FIG. 20 is a sectional view showing the principal part of the semiconductor device in the manufacturing process subsequent to FIG. 19.

Also, in another embodiment, the silicon layer constituting the resistor element of the semiconductor device can be formed of the same layer as the diffusions constituting the source/drain of the MISFET of the semiconductor device. FIGS. 19 and 20 are sectional views showing the principal part of the semiconductor device in the manufacturing process thereof, in which the silicon layer constituting the resistor element of the semiconductor device is formed of the same layer as the diffusions (semiconductor regions) constituting the source/drain of the MISFET of the semiconductor device.

As shown in FIG. 19, after forming the gate electrode 36 of the MISFET and the LDD sidewall 39, at the time of forming the diffusions serving as the source/drain of the MISFET (for example, the p⁺ type semiconductor 41 or the p⁻ source/drain region 38 serving as the source/drain of the p type MISFET 43) by the ion implantation, the ion implantation of an impurity is performed also to the n type well (or p type well) 91 formed in the region where the resistor element is to be formed, whereby a diffusion (p type semiconductor region) 92 constituting the resistor element is formed. Therefore, the resistor element is formed by the diffusion (single crystal silicon layer) 92 introducing an impurity into the single crystal silicon.

Note that if the diffusion (single crystal silicon layer) constituting the resistor element and the diffusions (single crystal silicon layer) serving as the source/drain of the MISFET are formed by single ion implantation into the semiconductor substrate and that the sheet resistances thereof are set equal to each other, then it is preferable that the number of manufacture steps and also the manufacturing cost of the semiconductor device can be reduced. However, the sheet resistance of the diffusion (single crystal silicon layer) constituting the resistor element can also be set different from those of the diffusions (single crystal silicon layer) serving as the source/drain of the MISFET by changing the conditions (kind of the impurity, the implantation amount, or the implantation energy) of the ion implantation for each of the region where the resistor element is to be formed and the region where the source/drain of the MISFET are to be formed.

Next, after the bipolar transistor is formed through almost the same process as that shown in FIGS. 14 to 16, the structure shown in FIG. 20 is obtained. In this case, since the diffusion 92 constituting the resistor element is already formed at the time of forming the diffusions serving as the source/drain of the MISFET, it is unnecessary to form the poly-Si layer pattern for resistor element at the time of patterning the base electrode 53*a*. Note that an insulator 93 covering the region where the silicide layer is not to be formed is formed on the diffusion 92. Thereafter, the silicide layer 70 is formed on each of: the poly-Si layer constituting the base electrode 53*a* of the bipolar transistor; the poly-Si layer constituting the emitter electrode 64 and the collector extraction region; the poly-Si layer constituting the gate electrode 36 of the MISFET; the diffusions serving as the source/drain (n⁺ type semiconductor 40 and p⁺ type semiconductor 41); and the diffusion 92 constituting the resistor element.

The structure shown in FIG. 20 almost corresponds to that shown in FIG. 16 except that the resistor element is formed using the diffusion 92. Additionally, the resistor element formed in FIG. 20 corresponds to that in FIG. 11, and the area and the positional relationship of the two silicide layers 70 formed on the diffusion 92 constituting the resistor element are equal to those of the silicide layers 4 and 5 (silicide layers 24 and 25) formed on the poly-Si layer 3 (p type semiconductor 23) constituting the resistor element.

The resistor element of the semiconductor is formed of the diffusion formed by introducing an impurity into the semiconductor substrate made of single crystal silicon instead of the poly-Si layer, and the diffusion constituting the resistor element is formed of the same layer as the diffusions constituting the source/drain of the MISFET of the semiconductor device. By so doing, the resistor element can be also manufactured in the manufacturing process of the MISFET, wherein it becomes possible to reduce the number of manufacture steps of the semiconductor device and also reduce the manufacturing cost of the semiconductor device.

FIGS. 21 to 24 are circuit diagrams showing an example of the circuit in which the resistor element according to this embodiment is used.

Figure 21:
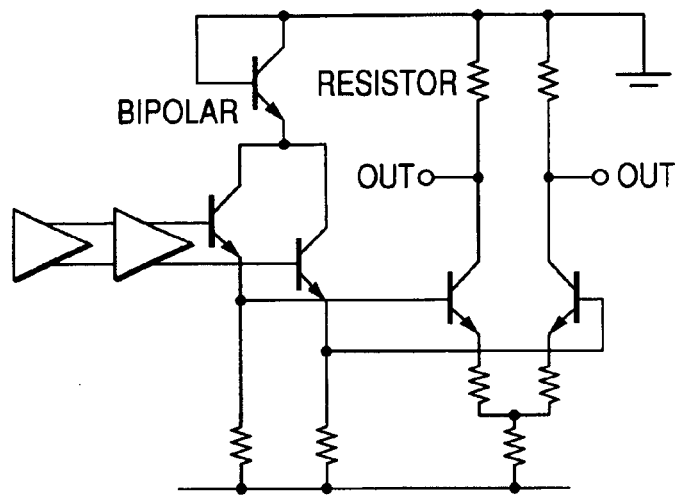
FIG. 21 is a circuit diagram in which a resistor element according to an embodiment of the present invention is used.

It is more preferable (effective) to use the resistor according to this embodiment, in a differential ECL (Emitter Coupled Logic) circuit used as a high-speed and high-frequency circuit as shown in FIG. 21. By adjusting the resistance value of the resistor element, it is possible to control the amplitude of output waveform and control a signal transmission circuit. Therefore, since high accuracy is required for the resistance value of the resistor element, the fine adjustment of the resistance value of the resistor element is indispensable. However, the adjustment of the resistance value can be facilitated by using the resistor element according to this embodiment.

Figure 22:
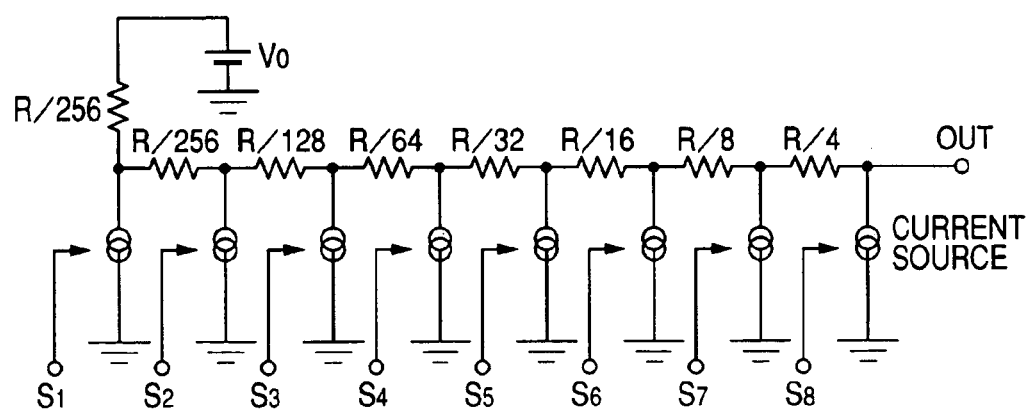
FIG. 22 is a circuit diagram in which a resistor element according to an embodiment of the present invention is used.

Also, it is more preferable to use the resistor element according to this embodiment, in a D/A converter (digital-analog converter) using a ladder circuit as shown in FIG. 22. Switches $S_1$ to $S_8$ drive current sources connected to the respective ends of the resistor elements. The potential outputted from the output terminal is the voltage obtained by subtracting a voltage drop amount of the resistor element from power supply voltage $V_0$. A 256 ($2^8$=256) kind of potentials are generated relative to an 8-bit digital signal and an analog signal is obtained. The fine adjustment of the resistance value of the resistor element is necessary for the accurate digital-analog conversion. However, the adjustment of the resistance value is facilitated at the time of using the resistor element according to this embodiment.

Figure 23:
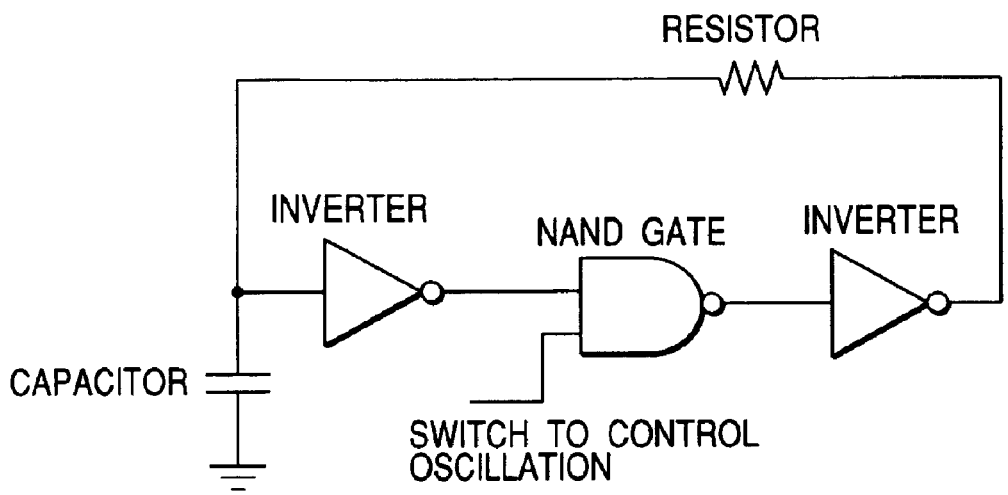
FIG. 23 is a circuit diagram in which a resistor element according to an embodiment of the present invention is used.

Also, it is more preferable to apply the resistor element according to this embodiment to a RC oscillator circuit as shown in FIG. 23. One input terminal of a NAND gate functions as a switch to control oscillation. The oscillation frequency is determined based on a RC time constant. It becomes possible to easily adjust the oscillation frequency by using the resistor element according to this embodiment and adjusting the resistance value thereof.

Figure 24:
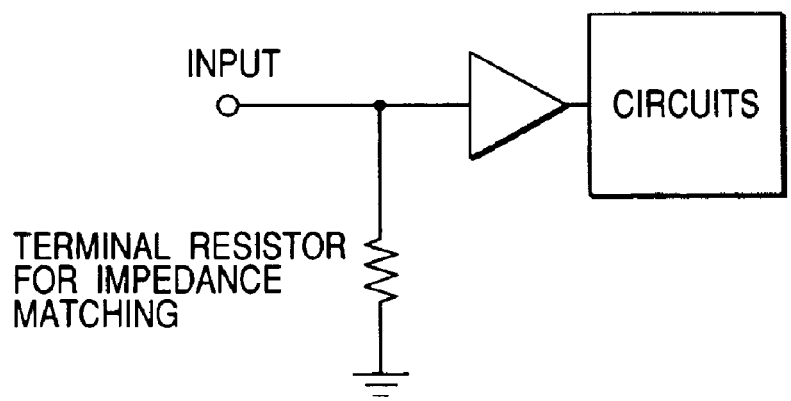
FIG. 24 is a circuit diagram in which the resistor element according to an embodiment of the present invention is used.

Also, it is more preferable to use the resistor element according to this embodiment as a terminal resistor as shown in FIG. 24. A circuit equipped with the terminal resistor is shown in FIG. 24, and the resistor element according to this embodiment is used as a terminal resistor portion for impedance-matching with the circuit. The terminal resistor is designed to have a value of, for example, 50Ω, and high accuracy is required for the resistance value of the resistor element in order to impedance-match with a circuit or line to be connected. When the resistance value varies, the impedance-matching (matching) is not achieved, whereby the reflection (reflection wave) is generated. However, since the resistor element according to this embodiment is used to finely adjust the resistance value, it is possible to adjust the resistance value with high accuracy and easily achieve the impedance-matching.

Therefore, if the resistor element according to this embodiment is used in the circuit in which the fine adjustment of the resistance value of the resistor element is required, it is possible to facilitate the fine adjustment of the resistance value of the resistor element and more easily obtain the desired circuit characteristics.

Also, it is more effective to use the resistor element according to this embodiment, in a semiconductor device (semiconductor integrated circuit device) mounting an extremely high-speed ECL circuit and/or an analog circuit such as an oscillator, the high-speed ECL circuit in which there is a strong possibility that performance and characteristics of the circuit are adjusted by adjusting the resistance value of the resistor element after circuit design and its evaluation. Furthermore, it is more effective to use the resistor element according to this embodiment, in a semiconductor device (semiconductor integrated circuit device) of a gate array system, the semiconductor device in which, after elements such as the resistor element and transistor are arranged in advance on the semiconductor substrate before circuit design, the resistor element is adjusted so as to have the desired resistance value after the circuit design, and then wiring layers for connecting the elements to each other are formed.

Second Embodiment

Figure 25:
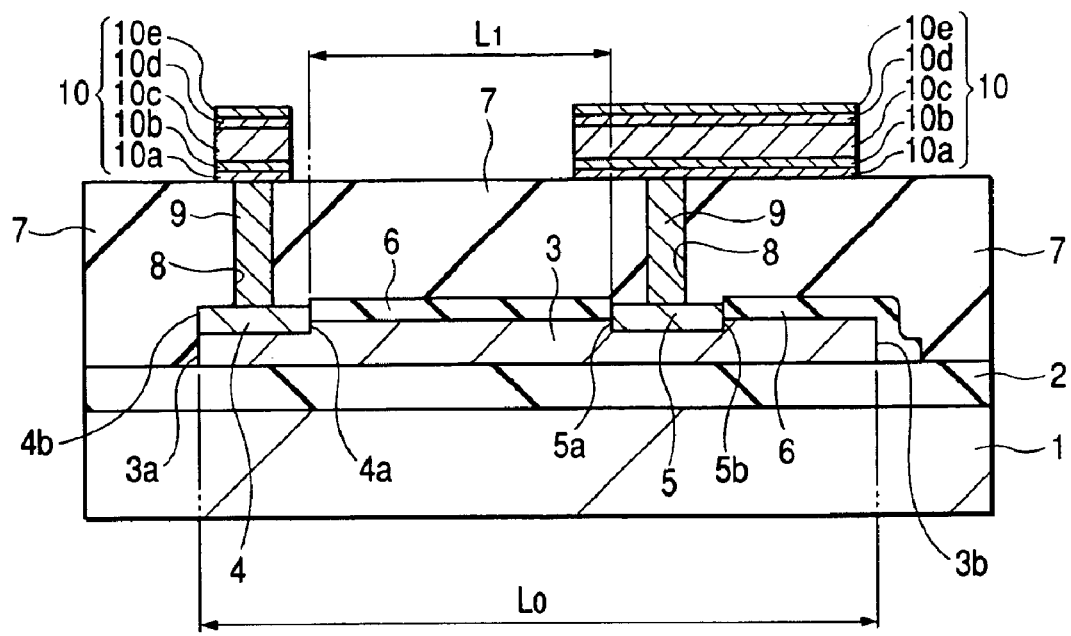
FIG. 25 is a sectional view showing the principal part of a structure of a resistor element in a semiconductor device according to another embodiment of the present invention.
Figure 26:
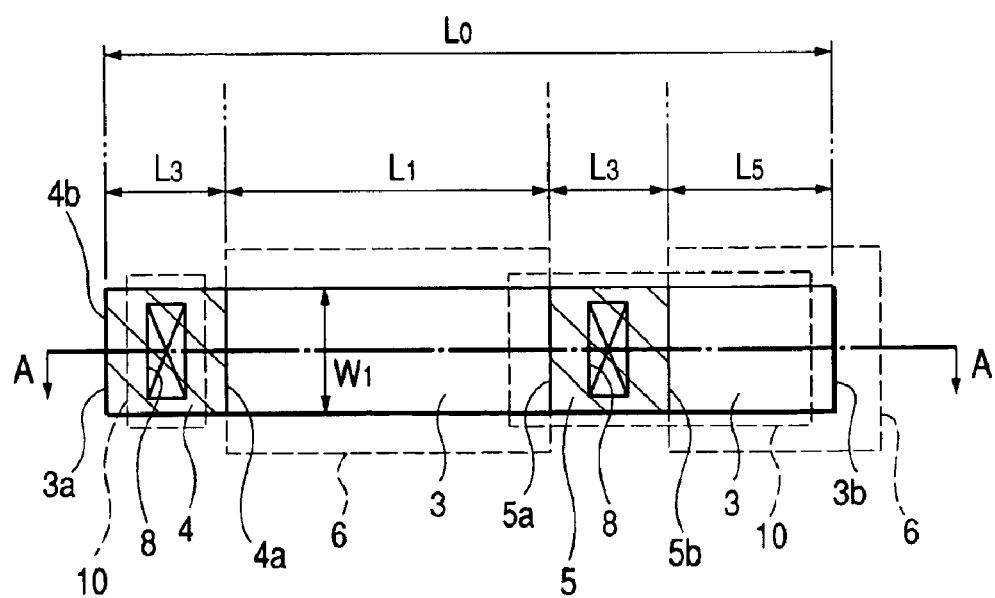
FIG. 26 is a plan view of the resistor element in FIG. 25.

FIG. 25 is a sectional view of a resistor element of a semiconductor device according to another embodiment of the present invention, and FIG. 26 is a plan view (layout diagram) thereof. A sectional view taken along ling A—A in FIG. 26 corresponds to FIG. 25. Note that FIGS. 25 and 26 correspond to FIGS. 1 and 2 in the first embodiment, respectively.

Similarly to the above-mentioned first embodiment, a resistor element in this embodiment is also formed of the poly-Si (polysilicon) layer 3 formed on the insulator 2 formed on the semiconductor substrate 1 as shown in FIG. 25. The amount of introduction of an impurity (implantation amount, impurity density) into the poly-Si layer 3 by the ion implantation is controlled so that the sheet resistance of the resistor element can be the desired resistance value in a range of, for example, several tens Ω/□ to several thousands Ω/□. The silicide layers (salicide layer) 4 and 5 are formed on the surface (upper surface) of the poly-Si layer 3 in the vicinity of both ends of the poly-Si silicon 3 constituting the resistor element. The silicide layers 4 and 5 are each formed of, for example, cobalt silicide ($CoSi_2$) that is a compound of cobalt (Co) belonging to the refractory metal and of silicon (Si). The compound of other refractory metal and silicon (Si), for example, titanium silicide ($TiSi_2$), tungsten silicide ($WSi_2$), molybdenum silicide ($MoSi_2$), tantalum silicide ($TaSi_2$) and the like may be used as a material of each of the silicide layers 4 and 5. Each sheet resistance of the silicide layers 4 and 5 is, for example, approximately several Ω/□ to several tens Ω/□, which is smaller than that of the poly-Si layer 3. The silicide layers 4 and 5 are electrically connected, through the plug contacts 9 (contact parts) buried in the contacts 8 formed in the insulator 7, to the electrodes (wirings) 10 formed of a laminated layer that is composed of the titanium layer 10a, the titanium nitride layer 10b, the aluminum layer 10c, the titanium layer 10d, and the titanium nitride layer 10e, etc.

In this embodiment, unlike the first embodiment, the area (shape) of the silicide layer 4 can be made approximately equal to that of the silicide layer 5. However, the one silicide layer 5 (at least one of the layers 4 and 5) is not formed at the end of the poly-Si layer 3 but formed a predetermined length $L_5$ away from the end toward the other silicide layer 4. For example, in FIGS. 25 and 26, an end 4b opposite to an end 4a of the silicide layer 4 located on a side facing the silicide layer 5 is located at the position almost corresponding to (equal to) that of an end 3a of the poly-Si layer 3. However, an end 5b opposite to an end 5a of the silicide layer 5 located on a side facing the silicide layer 4 is located the length $L_5$ away from the end 3b of the poly-Si layer 3. Therefore, the position of the silicide layer 4 on the poly-Si layer 3 is not symmetrical to that of the silicide layer 5 on the poly-Si layer 3.

In this embodiment, the length $L_1$ between the silicide layers 4 and 5 (length between the end 4a of the silicide layer 4 located on the side facing the silicide layer 5 and the end 5a of the silicide layer 5 located on the side facing the silicide layer 4) can be adjusted by adjusting the position of the silicide layer 5 provided on the poly-Si layer 3 without changing the shape of the poly-Si layer 3 (pattern shape, for example, the length in the extending direction of the poly-Si layer 3 (length in the longitudinal direction) $L_0$).

In this embodiment, the resistance value $R_0$ of the resistor element includes the resistance value of the poly-Si layer 3, the resistance values of the silicide layers 4 and 5, and the contact resistance values between the poly-Si layer 3 and the silicide layers 4 and 5, and it is given by the following formula:

$$R_0 = R_{S1} \times L_1/W_1 + R_0 \times 2/W_1.$$

In this case, the $R_{S1}$ corresponds to the sheet resistance ($\Omega/\square$) of the poly-Si layer 3. The $L_1$ corresponds to the length (closest length) between the silicide layers 4 and 5. The $W_1$ corresponds to the width (the width in the direction vertical to the extending direction of the poly-Si layer 3) of the resistor element (poly-Si layer 3). The $R_{C0}$ corresponds to the connection resistance between the resistor element (poly-Si layer 3) and the electrode (wiring) 10. The $R_{C0}$ is a value proportional to the width $W_1$ of the resistor element, and the contact resistance between the silicide layers 4 and 5 and the poly-Si layer 3 is the main component thereof.

The resistance value $R_0$ of the resistor element can be changed (adjusted) by changing the length $L_1$ between the silicide layers 4 and 5, and it is unnecessary to change the shape of the poly-Si layer 3. More specifically, the resistance value $R_0$ of the resistor element can be adjusted to a desired value, by changing the forming position of the silicide layer 5 on the poly-Si layer 3 (i.e., by changing the length $L_5$ between the end 5b of the silicide layer 5 and the end 3b of the poly-Si layer 3) while the shape of the poly-Si layer 3 (e.g., the length $L_0$ of the poly-Si layer 3) and the area or the shape of each of the two silicide layers 4 and 5 (e.g., the length $L_3$ of the silicide layers 4 and 5 in the extending direction (longitudinal side) on the poly-Si layer 3) are kept constant. Namely, the resistance value $R_0$ of the resistor element can be increased by moving, on the poly-Si layer 3 and on a nearer side of the end 3a, the forming position of the silicide layer 5 (by reducing the length $L_5$ to increase the length $L_1$), and then the resistance value $R_0$ of the resistor element can be reduced by moving, on the poly-Si layer 3 and on a nearer side of the silicide layer 4, the forming position of the silicide layer 5 (by increasing the length $L_5$ to reduce the length $L_1$).

Since the length $L_1$ between the silicide layers 4 and 5 is adjusted by changing the position of the silicide layer 5 formed on the poly-Si layer 3, it is unnecessary to change the shape (pattern shape) of the poly-Si layer 3. For example, it is unnecessary to change the length (length in the longitudinal direction) $L_0$ in the extending direction of the poly-Si layer 3. Additionally, when the position of the silicide layer 5 is changed, it becomes necessary to change the positions of the contacts 8 and the plug contacts 9 (contact parts) for connecting the silicide layer 5 to the electrode (wiring) 10. However, as shown in FIGS. 25 and 26, if the electrode (wiring) 10 connected to the silicide layer 5 is formed relatively largely so as to cover all of the range where the contact 8 is to be changed, it is unnecessary to change the shape (pattern shape) of the electrode (wiring) 10. Therefore, the masks (exposure masks) required for the adjustment of the resistance value $R_0$ of the resistor element are only masks (exposure masks) for forming the silicide layers 4 and 5 and masks (exposure masks) for forming the contacts 8. In this embodiment, the resistance value $R_0$ of the resistor element can be changed (adjusted) by changing the positions of ends (edges) of the silicide layers 4 and 5 without changing the shape (pattern shape) of the poly-Si layer 3 of the resistor element.

Additionally, since the area (shape) of the silicide layers 4 and 5 is not changed (is constant) in changing the resistance value of the resistor element in this embodiment, the contact resistances (contact resistances between the silicide layers 4 and 5 and the poly-Si layer 3) are not changed (are constant). Since the resistance value of the resistor element can be adjusted only by the adjustment of the length $L_1$ (of the poly-Si layer 3) between the silicide layers 4 and 5, the adjustment of the resistance value of the resistor element is further facilitated, whereby it is possible to accurately set the resistance value of the resistor element to a desired resistance value. Therefore, the change of the resistance value and the designing of the resistor element are further facilitated. Additionally, it becomes possible to reduce the time and labor required to obtain the desired resistance value.

In this embodiment, the forming position of the silicide layer 5 on the poly-Si layer 3 is changed on a nearer side of the end 3b of the poly-Si layer 3 in order to increase the resistance value of the resistor element, and the forming position of the silicide layer 5 on the poly-Si layer 3 is changed on a nearer side of the silicide layer 4 (on a side of the opposite end 3a of the poly-Si layer 3) in order to reduce the resistance value of the resistor element. After making a prototype of the circuit (semiconductor device) and evaluating the characteristics thereof, the resistance value of the resistor element is adjusted, whereby it becomes possible to manufacture the semiconductor device with desired characteristics and performance. However, it is not easy in the step of forming the prototype to determine whether the resistance value of the resistor element is to be increased or reduced later. Therefore, it is preferable that, in the prototype-making stage, the forming position (position of the end 5b) of the silicide layer 5 is set a predetermined length away from the end 3b of the poly-Si layer 3 (close to the center), and the forming position of the silicide layer 5 is changed (to a nearer side of the end 3b or a nearer side of the end 3a) after the characteristic evaluation, whereby the resistance value of the resistor element can be decreased or increased. By so doing, the degree of freedom (design freedom) in the change of the resistance value of the resistor element is increased. How much the position of the silicide layer 5 on the poly-Si layer 3 is set away from the end 3b of the poly-Si layer 3 can be determined based on an expected range of change (displacement range) in the resistance value of the resistor element. However, it is preferable that (the absolute value of) the difference between the length (corresponding to the length $L_5$) between the end 3b of the poly-Si layer 3 constituting the resistor element and the end 5b opposite to the end 5a of the silicide layer 5 facing the silicide layer 4, and the length between the end 3a of the poly-Si layer 3 constituting the resistor element and the end 4b opposite to the end 4a of the silicide layer 4 located on the side facing to the silicide layer 5 (approximately zero in FIGS. 25 and 26 but a predetermined value other than zero can be also set) can be set to be 5% of or more than the length L, (closest length) between the silicide layers 4 and 5, and more preferably set to be 10% of or more than the length $L_1$. In this manner, it becomes possible to appropriately adjust the resistance value of the resistor element to a desired value and, therefore, it becomes possible to achieve the manufacture of the semiconductor device with desired characteristics.

In this embodiment, the areas (shapes) of the silicide layers 4 and 5 are equal to each other. However, the positions of the silicide layers 4 and 5 formed on the poly-Si layer 3 constituting the resistor element are set so that the silicide layer 5 is located at a nearer side of the center portion than the silicide layer 4. Therefore, the length between the end (short side of the poly-Si layer 3 located on the side where the silicide layer 5 is formed) 3b of the poly-Si layer 3 constituting the resistor element and the end 5a of the silicide layer 5 located on the side facing the silicide layer 4 is made longer than the length between the end (short side of the poly-Si layer 3 located on the side where the silicide layer 4 is formed) 3a of the poly-Si layer 3 constituting the resistor element and the end 4a of the silicide layer 4 located on the side facing the silicide layer 5. Then, the length (closest length) L, between the silicide layers 4 and 5 is adjusted by changing the position of the end 5a of the silicide layer 5 facing the silicide layer 4, and the resistance value of the resistor element can be adjusted to a desired value, whereby it is preferable that (the absolute value of) the difference between the length between the end 3b of the poly-Si layer 3 constituting the resistor element and the end 5a of the silicide layer 5 located on the side facing the silicide layer 4, and the length between the end 3a of the poly-Si layer 3 constituting the resistor element and the end 4a of the silicide layer 4 located on the side facing the silicide layer 5 can be set to be 5% of or more than the length (closest length) $L_1$ between the silicide layers 4 and 5, and more preferably, set to be 10% of or more than the length $L_1$. In this manner, it becomes possible to appropriately adjust the resistance value of the resistor element to a desired value, and to achieve the manufacture of the semiconductor device with desired characteristics.

Third Embodiment

The desired circuit characteristics can be obtained by individually adjusting the resistance values of a plurality of resistor elements formed in the semiconductor device. In this case, at the prototype-making stage, a plurality of resistor elements each having the same shape are formed in the step of making a prototype, and the resistance values of the resistor elements are adjusted to optimum values after the characteristic evaluation subsequent to the prototype-making step. Therefore, although the poly-Si layers (or diffusions) constituting the resistor elements each have the same shape, the resistor elements having different resistance values are finally mixed by changing the area and the position of the silicide layers formed on the upper surface of the poly-Si layer.

Figure 27:
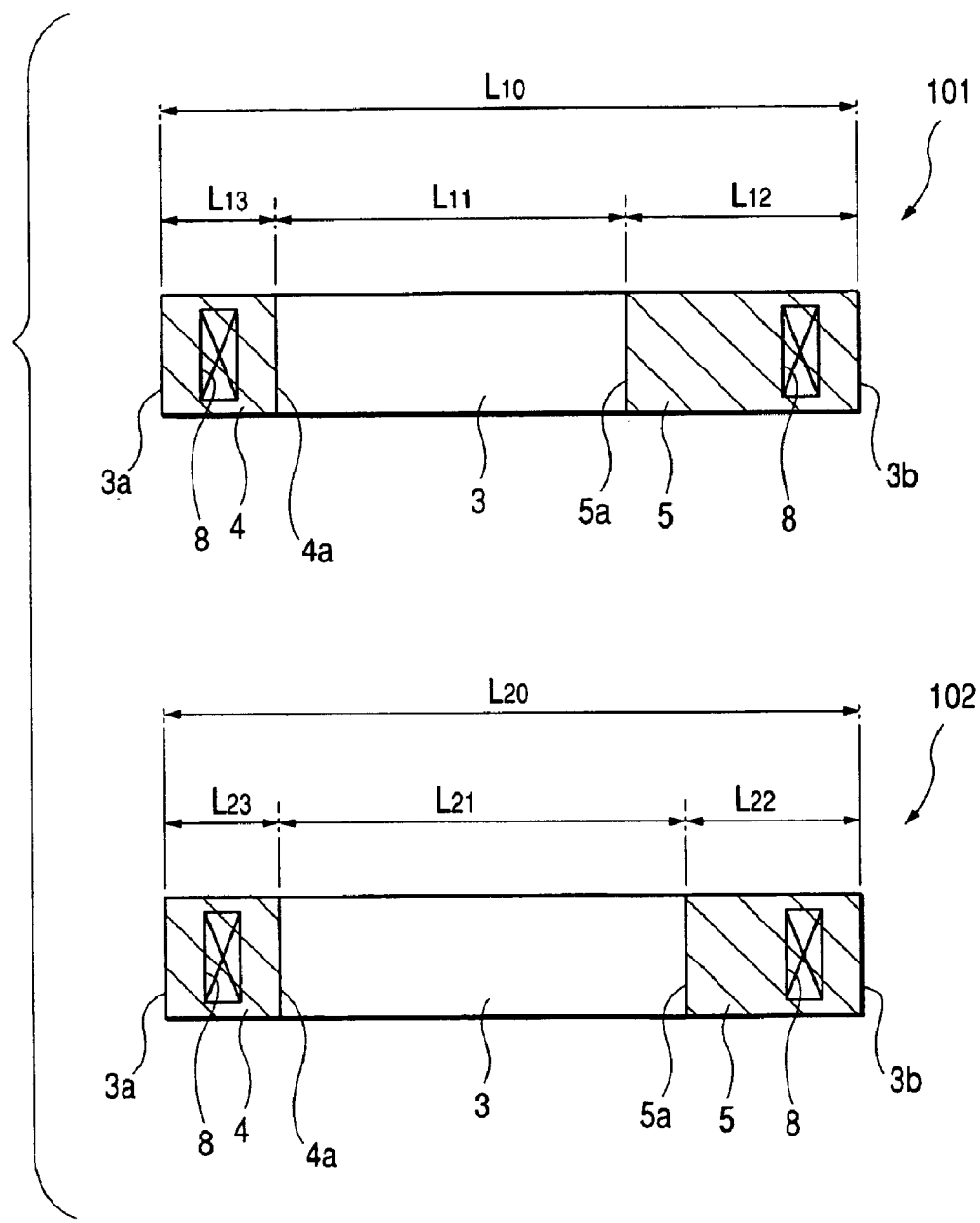
FIG. 27 is a plan view showing the semiconductor device in which a plurality of resistor elements are formed.
Figure 28:
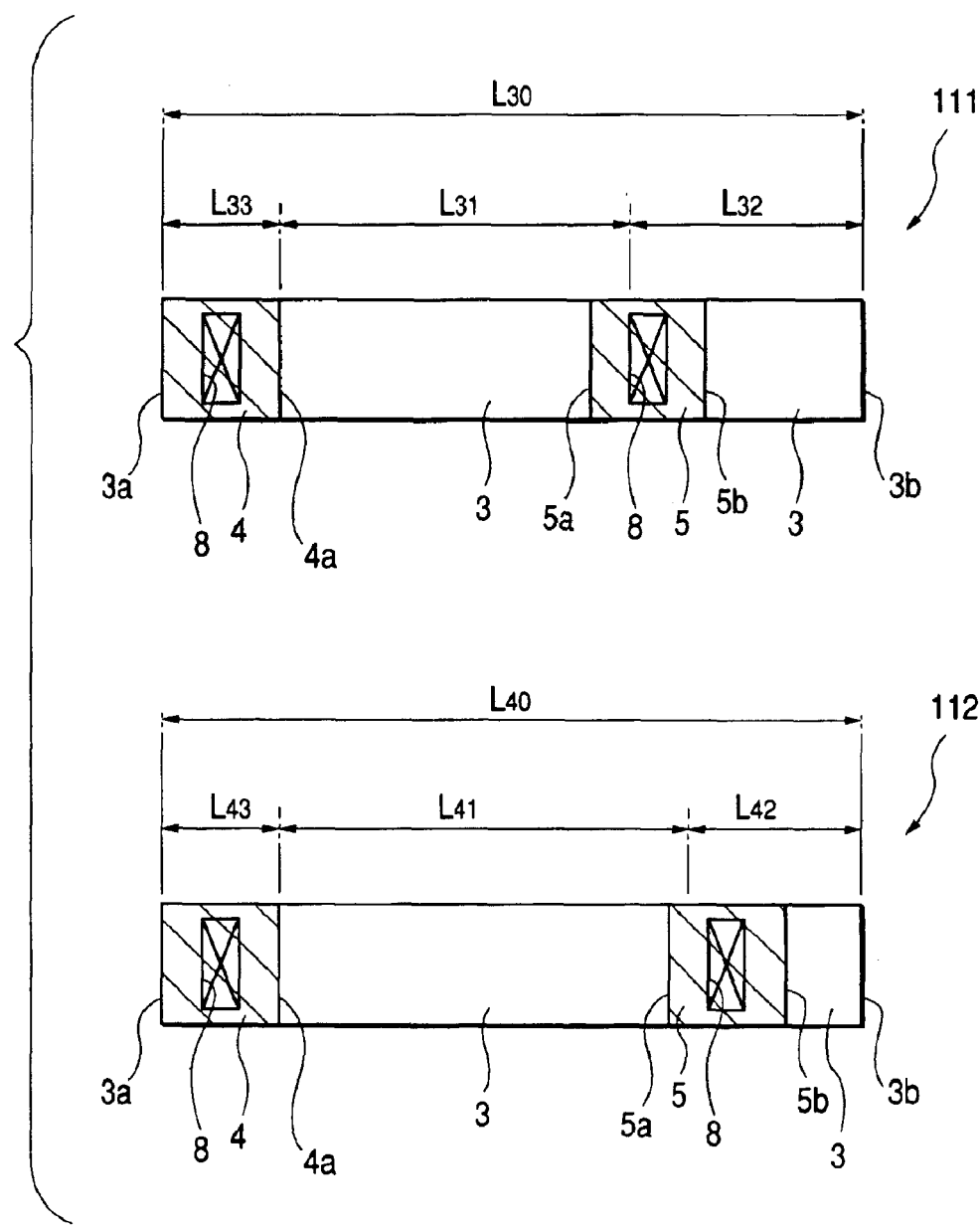
FIG. 28 is a plan view showing the semiconductor device in which a plurality of resistor elements are formed.

FIG. 27 is a plan view (layout diagram) showing an example of the semiconductor device in which a plurality of resistor elements, for example, two resistor elements are formed. FIG. 28 is a plan view (layout diagram) showing another example of the semiconductor device in which a plurality of resistor elements, for example, two resistor elements are formed. In FIGS. 27 and 28, the case where two resistor elements are formed is shown. However, the number of resistor elements to be formed is not limited to two and may be arbitrary one more than two.

Resistor elements 101 and 102 shown in FIG. 27 correspond to the resistor elements in the first embodiment shown in FIGS. 1 and 2. The shape of the poly-Si layer 3 constituting the resistor element 101 and the shape (pattern shape) of the poly-Si layer 3 constituting the resistor element 102 are almost identical to each other. For example, the length $L_{10}$ of the resistor element 101 in the extending direction (longitudinal direction) of the poly-Si layer 3 is almost equal to the length $L_{20}$ of the resistor element 102 in the extending direction (longitudinal direction) of the poly-Si layer 3. However, since the resistance values of the resistor elements 101 and 102 are adjusted individually, the areas (shape) of the silicide layers 5 of the resistor elements 101 and 102 are different from each other. More specifically, the silicide layer 5 of the resistor element 101 has a larger area in comparison to that of the resistor element 102 formed in the same semiconductor device. Therefore, the length (closest length) $L_{11}$ between the silicide layers 4 and 5 of the resistor element 101 becomes shorter than the length (closest length) $L_{12}$ between the silicide layers 4 and 5 of the resistor element 102, and the resistance value of the resistor element 101 becomes lower than that of the resistor element 102.

Also, the resistor elements 111 and 112 shown in FIG. 28 correspond to the resistor elements in the second embodiment shown in FIGS. 25 and 26. The shape (pattern shape) of the poly-Si layer 3 constituting the resistor element 111 is almost identical to that of the poly-Si layer 3 constituting the resistor element 112. For example, the length $L_{30}$ of the resistor element 111 in the extending direction (longitudinal direction) of the poly-Si layer 3 is almost equal to the length $L_{40}$ of the resistor element 112 in the extending direction (longitudinal direction) of the poly-Si layer 3. However, since the resistance values of the resistor elements 111 and 112 are adjusted individually, the forming positions of the silicide layers 5 are different from each other. More specifically, the silicide layer 5 of the resistor element 111 is formed on a nearer side of the silicide layer 4 in comparison to the resistor element 112 formed in the same semiconductor device. By so doing, the length (closest length) $L_{31}$ between the silicide layers 4 and 5 of the resistor element 111 becomes shorter than the length (closest length) $L_{41}$ between the silicide layers 4 and 5 of the resistor element 112, and the resistance value of the resistor element 111 becomes lower than that of the resistor element 112.

Accordingly, (the absolute value of) the difference ($L_{12}$–$L_{13}$) between the length $L_{12}$ between the end 3b of the poly-Si layer 3 and the end (end located on the side facing the silicide layer 4) 5a of the silicide layer 5 and the length $L_{13}$ between the end 3a of the poly-Si layer 3 and the end (end located on the side facing the silicide layer 5) 4a of the silicide layer 4 in the resistor element 101 is larger than (the absolute value of) the difference ($L_{22}$–$L_{23}$) between the length $L_{22}$ between the end 3b of the poly-Si layer 3 and the end (end located on the side facing the silicide layer 4) 5a of the silicide layer 5 and the length $L_{23}$ between the end 3a of the poly-Si layer 3 and the end (end located on the side facing the silicide layer 5) 4a of the silicide layer 4 in the resistor element 102 ($L_{12}$–$L_{13}$>$L_{22}$–$L_{23}$ or $|L_{12}$–$L_{13}|$>$|L_{22}$–$L_{23}|$) Further, (the absolute value of) the difference ($L_{32}$–$L_{33}$) between the length $L_{32}$ between the end 3b of the poly-Si layer 3 and the end (end located on the side facing the silicide layer 4) 5a of the silicide layer 5 and the length $L_{33}$ between the end 3a of the poly-Si layer 3 and the end (end located on the side facing the silicide layer 5) 4a of the silicide layer 4 in the resistor element 111 is larger than (the absolute value of) the difference ($L_{42}$–$L_{43}$) between the length $L_{42}$ between the end 3b of the poly-Si layer 3 and the end (end located on the side facing the silicide layer 4) 5a of the silicide layer 5 and the length $L_{43}$ between the end 3a of the poly-Si layer 3 and the end (end located on the side facing the silicide layer 5) 4a of the silicide layer 4 in the resistor element 112 ($L_{32}$–$L_{33}$>$L_{42}$–$L_{43}$ or $|L_{32}$–$L_{33}|$>$|L_{42}$–$L_{43}|$).

As described above, the resistance values of a plurality of the resistor elements (resistor elements 101 and 102 in FIG. 27 and resistor elements 111 and 112 in FIG. 28) formed of the poly-Si layer 3 or the like with the same shape (pattern) can be individually adjusted to the desired value based on results of the characteristic evaluation without changing the shape of the poly-Si layer 3, whereby it becomes possible to realize the semiconductor device with the desired characteristics.

In the foregoing, the invention made by the inventors thereof has been concretely described based on the embodiments. However, needless to say, the present invention is not limited to the foregoing embodiments and can be variously changed and modified without departing from the gist thereof.

In the foregoing embodiments, the semiconductor device including the resistor element, the bipolar transistor, and the MISFET has been described. However, the present invention is not limited to this, and it is possible to apply the present invention to various semiconductors each having the resistor element.

The effect obtained by the typical ones of the inventions disclosed in this application will be briefly described as follows.

The first silicide region and the second silicide region are formed on the resistor element made of silicon, and then the length between one end of the resistor element and the end of the first silicide region located on a side facing the second silicide region is made longer than the length between the other end of the resistor element and the end of the second silicide region located on a side facing the first silicide region. By so doing, it becomes possible to adjust the resistance value of the resistor element to a desired value without changing the dimensions thereof.

What is claimed is:

1. A semiconductor device comprising:
   a semiconductor substrate;
   a resistor element made of silicon and formed over said semiconductor substrate;
   a first silicide region and a second silicide region formed over said resistor element; and
   first and second contact parts electrically connected to said first and second silicide regions, respectively,
   wherein a first length between one end of said resistor element and an end of said first silicide region located on a side facing said second silicide region is longer than a second length between the other end of said resistor element and an end of said second silicide region located on a side facing said first silicide region.

2. The semiconductor device according to claim 1,
   wherein a difference between said first length and said second length is set to 5% of or more than the closest length between said first silicide region and said second silicide region.

3. The semiconductor device according to claim 1,
   wherein said first silicide region is larger than said second silicide region.

4. The semiconductor device according to claim 1,
   wherein a third length between said one end of said resistor element and an end opposite to said end of said first silicide region located on the side facing said second silicide region is longer than a fourth length between said other end of said resistor element and an end opposite to said end of said second silicide region located on the side facing said first silicide region.

5. The semiconductor device according to claim 4,
   wherein a difference between said third length and said fourth length is set to 5% of or more than the closest length between said first silicide region and said second silicide region.

6. The semiconductor device according to claim 4,
   wherein a size of said first silicide region is equal to that of said second silicide region.

7. The semiconductor device according to claim 1,
   wherein said resistor element is made of a poly-Si layer.

8. The semiconductor device according to claim 7, further comprising:
   a bipolar transistor formed over said semiconductor substrate,
   wherein said poly-Si layer constituting said resistor element is formed of the same layer as a poly-Si layer constituting a base electrode or an emitter electrode of said bipolar transistor.

9. The semiconductor device according to claim 7, further comprising:
   a MISFET formed over said semiconductor substrate,
   wherein said poly-Si layer constituting said resistor element is formed of the same layer as a poly-Si layer constituting a gate electrode of said MISFET.

10. The semiconductor device according to claim 1,
    wherein said resistor element is made of a diffusion formed by introducing an impurity into said semiconductor substrate.

11. The semiconductor device according to claim 10, further comprising:
    a MISFET formed over said semiconductor substrate,
    wherein said diffusion constituting said resistor element is formed of the same layer as diffusions constituting a source region and a drain region of said MISFET.

12. The semiconductor device according to claim 1,
    wherein said first silicide region and said second silicide region are made of a cobalt silicide layer, titanium silicide layer, tungsten silicide layer, molybdenum silicide layer, or tantalum silicide layer.

13. The semiconductor device according to claim 1,
    wherein said resistor element is a resistor element used in an ECL circuit.

14. The semiconductor device according to claim 1,
    wherein said resistor element is a resistor element used in a digital-analog converter.

15. The semiconductor device according to claim 1,
    wherein said resistor element is a resistor element used in an RC oscillator circuit.

16. The semiconductor device according to claim 1,
    wherein said resistor element constitutes a terminal resistor part.

17. A semiconductor device comprising:
    a semiconductor substrate;
    a first resistor element and a second resistor element made of silicon and formed over said semiconductor substrate;
    a first silicide region and a second silicide region formed over said first resistor element, and a third silicide region and a fourth silicide region formed over said second resistor element; and
    first, second, third, and fourth contact parts electrically connected to said first, second, third, and fourth silicide regions, respectively,
    wherein a difference between a length between one end of said first resistor element and an end of said first silicide region located on a side facing said second silicide region, and a length between the other end of said first resistor element and an end of said second silicide region located on a side facing said first silicide region is larger than a difference between a length between one end of said second resistor element and an end of said third silicide region located on a side facing said fourth silicide region, and a length between the other end of said second resistor element and an end of said fourth silicide region located on a side facing said third silicide region.

18. The semiconductor device according to claim 17,
    wherein a length of said first resistor element is equal to that of said second resistor element.

19. The semiconductor device according to claim 17,
wherein said first and second resistor elements are each formed of a poly-Si layer with the same pattern shape.

20. A manufacturing method of a semiconductor device, comprising the steps of:
- preparing a semiconductor substrate;
- forming, over said semiconductor substrate, a patterned poly-Si layer for forming a resistor element;
- forming an insulator over said poly-Si layer so as to expose a region where a silicide region is to be formed and so as to cover a region where a silicide region is not to be formed;
- forming a metal layer over said semiconductor substrate so as to cover said poly-Si layer and said insulator;
- performing a thermal treatment to react said metal layer with a part of said poly-Si layer which contacts to said metal layer, thereby forming a first silicide region and a second silicide region over said poly-Si layer; and
- forming a first contact part and a second contact part electrically connected to said first silicide region and said second silicide region, respectively,
- wherein a length between one end of said poly-Si layer and an end of said first silicide region located on a side facing said second silicide region is longer than a length between the other end of said poly-Si layer and an end of said second suicide region located on a side facing said first silicide region.

* * * * *